(12) United States Patent
Tezuka et al.

(10) Patent No.: US 8,884,297 B2
(45) Date of Patent: Nov. 11, 2014

(54) MICROCRYSTALLINE SILICON FILM, MANUFACTURING METHOD THEREOF, SEMICONDUCTOR DEVICE, AND MANUFACTURING METHOD THEREOF

(75) Inventors: Sachiaki Tezuka, Atsugi (JP); Yasuhiro Jinbo, Atsugi (JP); Toshinari Sasaki, Tochigi (JP); Hidekazu Miyairi, Atsugi (JP); Yosuke Kanzaki, Osaka (JP); Masao Moriguchi, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 71 days.

(21) Appl. No.: 13/696,865
(22) PCT Filed: May 6, 2011
(86) PCT No.: PCT/JP2011/061007
§ 371 (c)(1), (2), (4) Date: Nov. 8, 2012
(87) PCT Pub. No.: WO2011/142443
PCT Pub. Date: Nov. 17, 2011

(65) Prior Publication Data
US 2013/0056742 A1 Mar. 7, 2013

(30) Foreign Application Priority Data
May 14, 2010 (JP) .................. 2010-112164

(51) Int. Cl.
*H01L 21/336* (2006.01)
*H01L 21/205* (2006.01)
(Continued)

(52) U.S. Cl.
CPC .... *H01L 21/02513* (2013.01); *H01L 21/02422* (2013.01); *H01L 21/0262* (2013.01); *H01L*
(Continued)

(58) Field of Classification Search
USPC ............. 257/66, E29.273, E29.003, E21.101, 257/E21.409; 438/151, 479
See application file for complete search history.

(56) References Cited

U.S. PATENT DOCUMENTS

| 4,409,134 A | 10/1983 | Yamazaki |
| 5,017,308 A * | 5/1991 | Iijima et al. ................ 252/501.1 |

(Continued)

FOREIGN PATENT DOCUMENTS

| CN | 101926007 | 12/2010 |
| CN | 101960563 | 1/2011 |

(Continued)

OTHER PUBLICATIONS

Arai.T et al., "41.2: Micro Silicon Technology for Active Matrix OLED Display," SID Digest '07: SID International Symposium Digest of Technical Papers, 2007, vol. 38, pp. 1370-1373.

(Continued)

*Primary Examiner* — Victor A Mandala
(74) *Attorney, Agent, or Firm* — Eric J. Robinson; Robinson Intellectual Property Law Office, P.C.

(57) ABSTRACT

A manufacturing method of a microcrystalline silicon film includes the steps of forming a first microcrystalline silicon film over an insulating film by a plasma CVD method under a first condition; and forming a second microcrystalline silicon film over the first microcrystalline silicon film under a second condition. As a source gas supplied to a treatment chamber, a deposition gas containing silicon and a gas containing hydrogen are used. In the first condition, a flow rate of hydrogen is set at a flow rate 50 to 1000 times inclusive that of the deposition gas, and the pressure inside the treatment chamber is set 67 to 1333 Pa inclusive. In the second condition, a flow rate of hydrogen is set at a flow rate 100 to 2000 times inclusive that of the deposition gas, and the pressure inside the treatment chamber is set 1333 to 13332 Pa inclusive.

10 Claims, 12 Drawing Sheets

(51) Int. Cl.
*H01L 29/04* (2006.01)
*H01L 29/786* (2006.01)
*H01L 21/02* (2006.01)
*C23C 16/50* (2006.01)
*C23C 16/455* (2006.01)
*C23C 16/24* (2006.01)
*H01L 29/66* (2006.01)

(52) U.S. Cl.
CPC .............. 21/0245 (2013.01); *H01L 21/02502* (2013.01); *H01L 29/78696* (2013.01); *H01L 21/02488* (2013.01); *H01L 29/04* (2013.01); *C23C 16/50* (2013.01); *C23C 16/45523* (2013.01); *C23C 16/24* (2013.01); *H01L 21/02532* (2013.01); *H01L 29/66765* (2013.01); *H01L 21/02595* (2013.01)
USPC .............. 257/66; 257/E29.003; 257/E29.273; 257/E21.101; 257/E21.409; 438/151; 438/479

(56) References Cited

U.S. PATENT DOCUMENTS

| | | | |
|---|---|---|---|
| 5,374,481 A * | 12/1994 | Jeng et al. | 428/336 |
| 5,453,858 A | 9/1995 | Yamazaki | |
| 5,514,879 A | 5/1996 | Yamazaki | |
| 5,571,578 A | 11/1996 | Kaji et al. | |
| 5,582,880 A | 12/1996 | Mochizuki et al. | |
| 5,591,987 A | 1/1997 | Yamazaki et al. | |
| 5,614,732 A | 3/1997 | Yamazaki | |
| 5,648,293 A | 7/1997 | Hayama et al. | |
| 5,677,236 A | 10/1997 | Saitoh et al. | |
| 5,701,167 A | 12/1997 | Yamazaki | |
| 5,849,601 A | 12/1998 | Yamazaki | |
| 5,859,445 A | 1/1999 | Yamazaki | |
| 5,888,295 A * | 3/1999 | Sandhu et al. | 117/89 |
| 6,011,277 A | 1/2000 | Yamazaki | |
| 6,023,075 A | 2/2000 | Yamazaki | |
| 6,153,893 A | 11/2000 | Inoue et al. | |
| 6,252,249 B1 | 6/2001 | Yamazaki | |
| 6,265,288 B1 | 7/2001 | Okamoto et al. | |
| 6,271,055 B1 | 8/2001 | Yajima et al. | |
| 6,281,520 B1 | 8/2001 | Yamazaki | |
| 6,306,213 B1 | 10/2001 | Yamazaki | |
| 6,344,420 B1 | 2/2002 | Miyajima et al. | |
| 6,468,839 B2 | 10/2002 | Inoue et al. | |
| 6,737,676 B2 | 5/2004 | Yamazaki | |
| 6,855,621 B2 | 2/2005 | Kondo et al. | |
| 7,067,844 B2 | 6/2006 | Yamazaki | |
| 7,098,479 B1 | 8/2006 | Yamazaki | |
| 7,115,902 B1 | 10/2006 | Yamazaki | |
| 7,551,655 B2 | 6/2009 | Tanaka et al. | |
| 7,576,360 B2 | 8/2009 | Yamazaki | |
| 7,833,845 B2 | 11/2010 | Yamazaki et al. | |
| 7,915,520 B2 * | 3/2011 | Nishimura et al. | 136/255 |
| 2001/0023971 A1 * | 9/2001 | Kondo et al. | 257/458 |
| 2009/0002591 A1 | 1/2009 | Yamazaki et al. | |
| 2009/0033818 A1 | 2/2009 | Nakajima et al. | |
| 2009/0047759 A1 | 2/2009 | Yamazaki et al. | |
| 2009/0057683 A1 | 3/2009 | Nakajima et al. | |
| 2009/0061574 A1 | 3/2009 | Nakajima et al. | |
| 2009/0072237 A1 | 3/2009 | Yamazaki et al. | |
| 2009/0200551 A1 | 8/2009 | Won et al. | |
| 2009/0200552 A1 | 8/2009 | Won et al. | |
| 2009/0321737 A1 | 12/2009 | Isa et al. | |
| 2010/0216285 A1 | 8/2010 | Yokoi et al. | |
| 2010/0295047 A1 | 11/2010 | Moriguchi et al. | |
| 2011/0039402 A1 | 2/2011 | Yamazaki et al. | |
| 2011/0059562 A1 | 3/2011 | Yamazaki et al. | |
| 2011/0278582 A1 * | 11/2011 | Tezuka et al. | 257/66 |
| 2012/0021570 A1 * | 1/2012 | Tajima et al. | 438/157 |
| 2012/0052637 A1 * | 3/2012 | Komatsu et al. | 438/157 |
| 2012/0100675 A1 * | 4/2012 | Komatsu et al. | 438/158 |
| 2012/0115285 A1 * | 5/2012 | Komatsu et al. | 438/157 |
| 2012/0187408 A1 * | 7/2012 | Tanaka et al. | 257/64 |

FOREIGN PATENT DOCUMENTS

| | | |
|---|---|---|
| EP | 0535979 A | 4/1993 |
| JP | 04-242724 A | 8/1992 |
| JP | 05-129608 A | 5/1993 |
| JP | 05-275346 A | 10/1993 |
| JP | 06-077483 A | 3/1994 |
| JP | 07-045833 A | 2/1995 |
| JP | 07-131030 A | 5/1995 |
| JP | 07-162003 A | 6/1995 |
| JP | 07-211708 A | 8/1995 |
| JP | 08-017730 A | 1/1996 |
| JP | 08-031749 A | 2/1996 |
| JP | 09-232235 A | 9/1997 |
| JP | 2000-174310 A | 6/2000 |
| JP | 2000-269201 A | 9/2000 |
| JP | 2000-277439 A | 10/2000 |
| JP | 2001-053283 A | 2/2001 |
| JP | 3201492 | 8/2001 |
| JP | 2002-206168 A | 7/2002 |
| JP | 2002-246605 A | 8/2002 |
| JP | 2002-280309 A | 9/2002 |
| JP | 2003-037278 A | 2/2003 |
| JP | 2004-193528 A | 7/2004 |
| JP | 2004-200345 A | 7/2004 |
| JP | 2005-049832 A | 2/2005 |
| JP | 2005-167264 A | 6/2005 |
| JP | 2005-191546 A | 7/2005 |
| JP | 2006-237490 A | 9/2006 |
| JP | 2008-124392 A | 5/2008 |
| JP | 2009-044134 A | 2/2009 |
| JP | 2009-076753 A | 4/2009 |
| JP | 2009-088501 A | 4/2009 |
| WO | WO-2009/093462 | 7/2009 |
| WO | WO-2009/102520 | 8/2009 |
| WO | WO-2009/157574 | 12/2009 |

OTHER PUBLICATIONS

Lee.C et al., How to Achieve High Mobility Thin Film Transistors by Direct Deposition of Silicon Using 13.56 MHZ RF PECVD? IEDM 06: Technical Digest of International Electron Devices Meetings, Dec. 11, 2006, pp. 295-298.

Lee.C et al., "Directly Deposited Nanocrystalline Silicon Thin-Film Transistors With Ultra High Mobilities," Appl. Phys. Lett. (Applied Physics Letters), Dec. 18, 2006, vol. 89, No. 25, pp. 252101-1-252101-3.

Lee.C at al., "High-Mobility Nanocrystalline Silicon Thin-Film Transistors Fabricated by Plasma-Ehanced Chemical Vapor Deposition," Appl. Phys. Lett. (Applied Physics Letters), May 24, 2005, Vol. 86, pp. 222106-1-222106-3.

Lee.C et al., "High-Mobility N-Channel and P-Channel Nanocrystalline Silicon Thin-Film Transistors," IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays," IEDM 06: Technical Digest of International Electron Devices Meeting, 2006, pp. 303-306.

Lee.H et al., "Leakage Current Mechanisms in Top-Gate Nanocrystalline Silicon Thin-Film Transistors," Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced from Constant Current Stress Measurements," Appl. Phys. Lett. (Applied Physics Letters), Sep. 12, 2007, vol. 9, No. 11, pp. 113511-1-113511-3.

Lee.C et al., "Stability of NC-SI:H TFTS With Silicon Nitride Gate Dielectric," IEEE Transactions on Electron Devices, Jan. 2007, vol. 54, No. 1, pp. 45-51.

Sazonov.A et al., "Low-Temperature Materials and Thin Film Transistors for Flexible Electronics," Proceedings of the IEEE, Aug. 1, 2005, vol. 93, No. 8, pp. 1420-1428.

(56) References Cited

OTHER PUBLICATIONS

Lee.C et al., "Postdeposition Thermal Annealing and Material Stability of 75° C. Hdrogenated Nanocystalline Silicon Plasma-Enhanced Chemical Vapor Deposition Films," J. Appl. Phys. (Journal of Applied Physics), Aug. 4, 2005, vol. 98, No. 3, pp. 034305-1-034305-7.

International Search Report (Application No. PCT/JP2011/061007) Dated Jul. 12, 2011.

Written Opinion (Application No. PCT/JP2011/061007) Dated Jul. 12, 2011.

* cited by examiner

MICROCRYSTALLINE SILICON FILM, MANUFACTURING METHOD THEREOF, SEMICONDUCTOR DEVICE, AND MANUFACTURING METHOD THEREOF

TECHNICAL FIELD

The present invention relates to a microcrystalline silicon film, a manufacturing method thereof, a semiconductor device including the microcrystalline silicon film, and a manufacturing method thereof.

BACKGROUND ART

As one type of field-effect transistor, a thin film transistor whose channel region is formed using a silicon film which is formed over a substrate having an insulating surface is known. Techniques in which amorphous silicon, microcrystalline silicon, or polycrystalline silicon is used for the silicon film which is used for the channel region of the thin film transistor have been disclosed (see Patent Documents 1 to 5). A typical application of the thin film transistor is a liquid crystal television device, in which the thin film transistor is practically used as a switching transistor in each pixel in a display screen.

A thin film transistor whose channel region is formed using an amorphous silicon film has problems of low field-effect mobility and low on-state current. On the other hand, a thin film transistor whose channel region is formed using a microcrystalline silicon film has a problem in that, though the field-effect mobility is improved, the off-state current is higher as compared to that of the thin film transistor whose channel region is formed using an amorphous silicon film and thus sufficient switching characteristics cannot be obtained.

A thin film transistor whose channel region is formed using a polycrystalline silicon film features in that the field-effect mobility is far higher and the on-state current is higher than those of the above-described two kinds of thin film transistors. These features enable this kind of thin film transistor to be used not only as a switching transistor in a pixel but also as an element of a driver circuit that needs to drive at high speed.

However, a manufacturing process of the thin film transistor whose channel region is formed using a polycrystalline silicon film involves a crystallization step for a silicon film and has a problem of higher manufacturing costs, as compared to a manufacturing process of the thin film transistor whose channel region is formed using an amorphous silicon film. For example, a laser annealing technique necessary in the process for forming a polycrystalline silicon film has a problem in that large-screen liquid crystal panels cannot be produced efficiently because the area capable of being irradiated with a laser beam is small.

The size of a glass substrate for manufacturing display panels has grown in the following ascending order: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm) The increase in size of the glass substrate is based on the concept of minimum cost design.

However, a technique with which a thin film transistor capable of high-speed operation can be manufactured with high productivity over a large-sized mother glass substrate such as the 10th generation (2950 mm×3400 mm) mother glass substrate has not been established yet, which is a problem in industry.

Reference

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546

DISCLOSURE OF INVENTION

An object of an embodiment of the present invention is to provide a manufacturing method of a microcrystalline silicon film having high crystallinity. Another object of an embodiment of the present invention is to provide a manufacturing method of a semiconductor device which has favorable electric characteristics with high productivity.

An embodiment of the present invention is a manufacturing method of a microcrystalline silicon film. In the manufacturing method, after a first microcrystalline silicon film is formed under a first condition which allows the density of mixed phase grains to be low and the crystallinity of the mixed phase grains to be high, a second microcrystalline silicon film is formed to be stacked over the first microcrystalline silicon film under a second condition which allows the second microcrystalline silicon film to fill a space between the mixed phase grains of the first microcrystalline silicon film and also promotes crystal growth.

The first condition which allows the density of mixed phase grains to be low and the crystallinity of the mixed phase grains to be high is a condition in which a deposition gas containing silicon is diluted with hydrogen by setting the flow rate of hydrogen at a flow rate greater than or equal to 50 times and less than or equal to 1000 times that of the deposition gas, and the pressure inside a treatment chamber is set higher than or equal to 67 Pa and lower than or equal to 1333 Pa. The second condition which allows the second microcrystalline silicon film to fill a space between the mixed phase grains of the first microcrystalline silicon film and also promotes crystal growth is a condition in which a deposition gas containing silicon is diluted with hydrogen by setting the flow rate of hydrogen at a flow rate greater than or equal to 100 times and less than or equal to 2000 times that of the deposition gas, and the pressure inside a treatment chamber is set higher than or equal to 1333 Pa and lower than or equal to 13332 Pa.

Another embodiment of the present invention is a manufacturing method of a semiconductor device including a thin film transistor whose channel region is formed using the stacked first and second microcrystalline silicon films.

An embodiment of the present invention is a manufacturing method of a microcrystalline silicon film, which includes the steps of: forming a first microcrystalline silicon film which includes a mixed phase grain including a silicon crystallite and amorphous silicon, over an insulating film by a plasma CVD method under a first condition; and forming a second microcrystalline silicon film over the first microcrystalline silicon film by a plasma CVD method under a second condition. In the manufacturing method, the first condition is a condition in which a deposition gas containing silicon and a gas containing hydrogen are used as a source gas supplied to a treatment chamber, the deposition gas is diluted with hydrogen by setting a flow rate of hydrogen at a ratio greater than or equal to 50 times and less than or equal to 1000 times that of the deposition gas, and a pressure inside the treatment chamber is set higher than or equal to 67 Pa and lower than or equal to 1333 Pa. The second condition is a condition in which a deposition gas containing silicon and a gas containing hydrogen are used as a source gas supplied to a treatment chamber, the deposition gas is diluted with hydrogen by setting a flow rate of hydrogen at a flow rate greater than or equal to 100 times and less than or equal to 2000 times that of the deposition gas, and a pressure inside the treatment chamber is set higher than or equal to 1333 Pa and lower than or equal to 13332 Pa. It is preferable to determine the power for generating the plasma as appropriate in accordance with the ratio of the flow rate of hydrogen to the flow rate of the deposition gas containing silicon.

In the above embodiment of the present invention, a third microcrystalline silicon film can be formed over the second microcrystalline silicon film by a plasma CVD method under a third condition, after the second microcrystalline silicon film is formed under the second condition. The third condition can be a condition in which a deposition gas containing silicon and a gas containing hydrogen are used as a source gas supplied to a treatment chamber, the deposition gas is diluted with hydrogen by setting a ratio of a flow rate of hydrogen to a flow rate of the deposition gas at a ratio higher than that in the second condition, and a pressure inside the treatment chamber is set higher than or equal to 1333 Pa and lower than or equal to 13332 Pa.

Further in the above embodiment, the first condition is preferably a condition which allows mixed phase grains serving as nuclei to be formed and a density of mixed phase grains to be low, and the second condition is preferably a condition which allows a density of the second microcrystalline silicon film to be high.

Further in the above embodiment, a rare gas can be contained in at least one of the source gas used in the first condition, the source gas used in the second condition, and the source gas used in the third condition.

Another embodiment of the present invention is a manufacturing method of a microcrystalline silicon film, which includes the steps of: forming a first microcrystalline silicon film including a plurality of mixed phase grains over an insulating film by a plasma CVD method under a first condition which allows the mixed phase grains serving as nuclei to be formed and a density of mixed phase grains to be low; and forming a second microcrystalline silicon film over the first microcrystalline silicon film by a plasma CVD method under a second condition which allows the second microcrystalline silicon film to fill a space between the mixed phase grains of the first microcrystalline silicon film and a density of the second microcrystalline silicon film to be high. The mixed phase grains include a silicon crystallite and amorphous silicon.

In the above embodiment, the first condition is preferably a condition which allows higher crystallinity of the mixed phase grains and lower crystal growth rate of the mixed phase grains than those in the second condition.

Another embodiment of the present invention is a manufacturing method of a semiconductor device including a thin film transistor including a gate electrode, a source region, a drain region, and a channel region, which includes a step of: forming a microcrystalline silicon film used to form the channel region by forming a first microcrystalline silicon film including a mixed phase grain including a silicon crystallite and amorphous silicon by a plasma CVD method under a first condition and forming a second microcrystalline silicon film over the first microcrystalline silicon film by a plasma CVD method under a second condition. The first condition is a condition in which a deposition gas containing silicon and a gas containing hydrogen are used as a source gas supplied to a treatment chamber, the deposition gas is diluted with hydrogen by setting a flow rate of hydrogen at a flow rate greater than or equal to 50 times and less than or equal to 1000 times that of the deposition gas, and a pressure inside the treatment chamber is set higher than or equal to 67 Pa and lower than or equal to 1333 Pa. The second condition is a condition in which a deposition gas containing silicon and a gas containing hydrogen are used as a source gas supplied to a treatment chamber, the deposition gas is diluted with hydrogen by setting a flow rate of hydrogen at a flow rate greater than or equal to 100 times and less than or equal to 2000 times that of the deposition gas, and a pressure inside the treatment chamber is set higher than or equal to 1333 Pa and lower than or equal to 13332 Pa.

In the above embodiment, the microcrystalline silicon film can be formed by forming a third microcrystalline silicon film over the second microcrystalline silicon film by a plasma CVD method under a third condition after the second microcrystalline silicon film is formed under the second condition. The third condition can be a condition in which a deposition gas containing silicon and a gas containing hydrogen are used as a source gas supplied to a treatment chamber, the deposition gas is diluted with hydrogen by setting a ratio of a flow rate of hydrogen to a flow rate of the deposition gas at a ratio higher than that in the second condition, and the pressure inside the treatment chamber is set higher than or equal to 1333 Pa and lower than or equal to 13332 Pa.

Another embodiment of the present invention is a manufacturing method of a semiconductor device including a thin film transistor including a gate electrode, a source region, a drain region, and a channel region. The manufacturing method includes a step of: forming a microcrystalline silicon film used to form the channel region by forming a first microcrystalline silicon film including a plurality of mixed phase grains over an insulating film by a plasma CVD method under a first condition which allows the mixed phase grains serving as nuclei to be formed and a density of mixed phase grains to be low, and forming a second microcrystalline silicon film over the first microcrystalline silicon film by a plasma CVD method under a second condition which allows the second microcrystalline silicon film to fill a space between the mixed phase grains of the first microcrystalline silicon film and a density of the second microcrystalline silicon film to be high.

Another embodiment of the present invention is a microcrystalline silicon film formed over an insulating film and including mixed phase grains including a silicon crystallite and amorphous silicon. The mixed phase grains have a grain size greater than or equal to 2 nm and less than or equal to 200 nm (preferably, greater than or equal to 10 nm and less than or equal to 80 nm, further preferably greater than or equal to 20 nm and less than or equal to 50 nm, and still further preferably greater than or equal to 25 nm and less than or equal to 33 nm). The microcrystalline silicon film has a density greater than 1.9 g/cm$^3$ and less than or equal to 2.3 g/cm$^3$, and the microcrystalline silicon film has a resistivity higher than or equal to $1.0 \times 10^5$ Ω·cm and lower than or equal to $1.0 \times 10^8$ Ω·cm, preferably higher than or equal to $5 \times 10^6$ Ω·cm and lower than or equal to $5.0 \times 10^7$ Ω·cm. In addition, the microcrystalline silicon film has an activation energy of conductivity of 0.5 eV to 0.6 eV.

Further in the above embodiment, the microcrystalline silicon film is preferably a film in which a second microcrystalline silicon film is stacked over a first microcrystalline silicon film. The first microcrystalline silicon film is preferably formed by a plasma CVD method under a first condition which allows the mixed phase grains serving as nuclei to be formed and a density of mixed phase grains to be low, and the second microcrystalline silicon film is preferably formed by a plasma CVD method under a second condition which allows the second microcrystalline silicon film to fill a space between the mixed phase grains of the first microcrystalline silicon film and a density of the second microcrystalline silicon film to be high.

Another embodiment of the present invention is a semiconductor device including a thin film transistor including a gate electrode, a source region, a drain region, and a channel region. The channel region is formed using a microcrystalline silicon film including a mixed phase grain including a silicon crystallite and amorphous silicon. The mixed phase grain has a grain size greater than or equal to 2 nm and less than or equal to 200 nm (preferably, greater than or equal to 10 nm and less than or equal to 80 nm, further preferably greater than or equal to 20 nm and less than or equal to 50 nm, and still further preferably greater than or equal to 25 nm and less than or equal to 33 nm). The microcrystalline silicon film has a density greater than 1.9 g/cm$^3$ and less than or equal to 2.3 g/cm$^3$. The microcrystalline silicon film has a resistivity higher than or equal to $1.0 \times 10^5$ Ω·cm and lower than or equal to $1.0 \times 10^8$ Ω·cm, preferably higher than or equal to $5 \times 10^6$ Ω·cm and lower than or equal to $5.0 \times 10^7$ Ω·cm. In addition, the microcrystalline silicon film has an activation energy of 0.5 eV to 0.6 eV.

With the use of an embodiment of the present invention, a microcrystalline silicon film having high crystallinity can be formed. Furthermore, with the use of an embodiment of the present invention, a semiconductor device having favorable electric characteristics can be manufactured with high productivity.

BEST MODE FOR CARRYING OUT THE INVENTION

Hereinafter, embodiments of the present invention will be described in detail with reference to the drawings. However, the present invention is not limited to the following description and it is easily understood by those skilled in the art that the mode and details can be variously changed without departing from the scope and spirit of the present invention. Therefore, the present invention should not be construed as being limited to the description of the following embodiments.

(Embodiment 1)

In this embodiment, a manufacturing method of a microcrystalline silicon film having high crystallinity will be described with reference to FIGS. 1A and 1B.

Figure 1A:
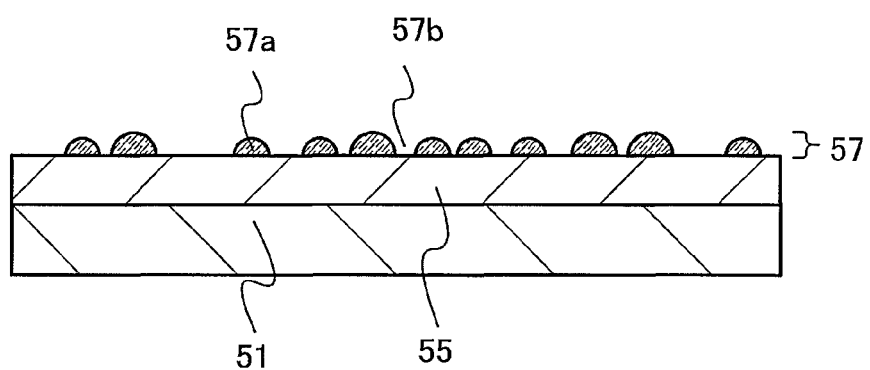
FIGS. 1A and 1B are cross-sectional views illustrating a manufacturing method of a microcrystalline silicon film having high crystallinity according to an embodiment of the present invention.

As illustrated in FIG. 1A, an insulating film 55 is formed over a substrate 51, and a first microcrystalline silicon film 57 which includes mixed phase grains 57a including silicon crystallites and amorphous silicon is formed over the insulating film 55 using a plasma CVD method.

As the substrate 51, a glass substrate, a ceramic substrate, or the like can be used. Note that there is no limitation on the size of the substrate 51. For example, any of glass substrates of the 3rd to 10th generations which are often used in the field of the above flat panel displays can be used.

The insulating film 55 can be formed as a single layer or a stacked layer using a silicon nitride film or a silicon nitride oxide film by a CVD method, a sputtering method, or the like.

The first microcrystalline silicon film 57 has low density of mixed phase grains 57a (the existing percentage of mixed phase grains in a plane) and high crystallinity of the mixed phase grains 57a. Therefore, the first microcrystalline silicon film 57 may have a space 57b between the adjacent mixed phase grains 57a without the adjacent mixed phase grains 57a being in contact with each other. The thickness of the first microcrystalline silicon film 57 is preferably greater than or equal to 1 nm and less than or equal to 10 nm. In a region having the space 57b between the adjacent mixed phase grains 57a without the adjacent mixed phase grains 57a being in contact with each other, the smallest height of the mixed phase grains 57a which are not in contact with each other is 1 nm or more and the largest height of the mixed phase grains 57a which are not in contact with each other is 10 nm or less. Note that the mixed phase grains 57a each include an amorphous silicon region and a plurality of crystallites that are microcrystals regarded as single crystals. In some cases, the mixed phase grains 57a may include a twin crystal.

The first microcrystalline silicon film 57 is formed in a treatment chamber of a plasma CVD apparatus, using plasma generated by glow discharge with the use of a mixture of a deposition gas containing silicon and hydrogen as a source gas, under a first condition which allows mixed phase grains serving as nuclei to be formed in the state that the density of mixed phase grains is low and the crystallinity of the mixed phase grains is high. Alternatively, the first microcrystalline silicon film 57 is formed using plasma generated by glow discharge with the use of a mixture of a deposition gas containing silicon, hydrogen, and a rare gas such as helium, neon, argon, krypton, or xenon. Here, the microcrystalline silicon is formed under the first condition in which the deposition gas containing silicon is diluted with hydrogen by setting the flow rate of hydrogen at a flow rate greater than or equal to 50 times and less than or equal to 1000 times that of the deposition gas and the pressure inside the treatment chamber is set higher than or equal to 67 Pa and lower than or equal to 1333 Pa (higher than or equal to 0.5 Torr and lower than or equal to 10 Torr). The deposition temperature at this time is preferably from room temperature to 300° C., and further preferably 150° C. to 280° C. The distance between an upper electrode and a lower electrode of the plasma CVD apparatus may be set to a distance which allows generation of plasma. With the first condition, crystal growth is promoted and the crystallinity of the mixed phase grains 57a is increased. That is, the size of the crystallites included in the mixed phase grains 57a is increased. Further, the space 57b is formed between the adjacent mixed phase grains 57a, so that the density of mixed phase grains 57a is lowered.

As typical examples of the deposition gas containing silicon, there are $SiH_4$ and $Si_2H_6$.

In the case where a rare gas such as helium, argon, neon, krypton, or xenon is mixed into the source gas of the first microcrystalline silicon film 57, the deposition rate of the first microcrystalline silicon film 57 can be increased. Moreover, in the case where the deposition rate is increased, the amount of impurities mixed in the first microcrystalline silicon film 57 is reduced, so that the crystallinity of the first microcrystalline silicon film 57 can be improved.

In the glow discharge at the time of forming the first microcrystalline silicon film 57, the plasma is generated by application of high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. It is preferable to determine the power for generating the plasma as appropriate in accordance with the ratio of the flow rate of hydrogen to the flow rate of the deposition gas containing silicon.

Figure 1B:
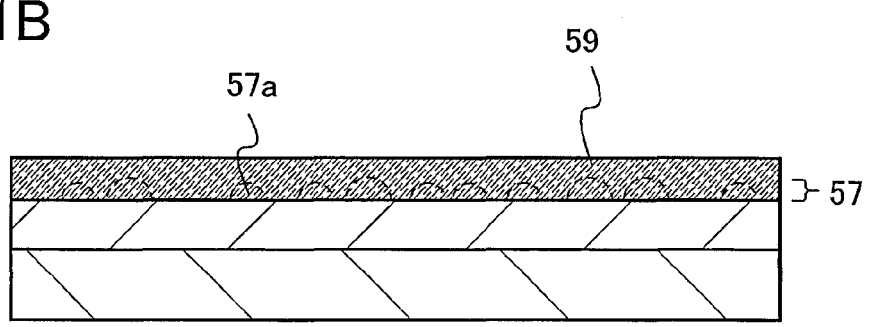

Next, as illustrated in FIG. 1B, a second microcrystalline silicon film 59 is formed over the first microcrystalline silicon film 57. The second microcrystalline silicon film 59 is formed under a condition which allows the second microcrystalline silicon film 59 to fill the space 57b between the mixed phase grains 57a of the first microcrystalline silicon film 57 and also promotes crystal growth. Note that the thickness of the second microcrystalline silicon film 59 is preferably greater than or equal to 30 nm and less than or equal to 100 nm.

The second microcrystalline silicon film 59 is formed in a treatment chamber of the plasma CVD apparatus, using plasma generated by glow discharge with the use of a mixture of a deposition gas containing silicon and hydrogen as a source gas under a second condition. Alternatively, the second microcrystalline silicon film 59 may be formed using plasma generated by glow discharge with the use of a mixture of a deposition gas containing silicon, hydrogen, and a rare gas such as helium, neon, argon, krypton, or xenon under the second condition. Here, the microcrystalline silicon is formed under the second condition in which the deposition gas containing silicon is diluted with hydrogen by setting the flow rate of hydrogen at a flow rate greater than or equal to 100 times and less than or equal to 2000 times that of the deposition gas and the pressure inside the treatment chamber is set higher than or equal to 1333 Pa and lower than or equal to 13332 Pa (higher than or equal to 10 Torr and lower than or equal to 100 Torr). As a result, the ratio of a crystalline region to the amorphous semiconductor region is increased in the second microcrystalline silicon film 59, whereby the crystallinity is increased. The deposition temperature at this time is preferably from room temperature to 300° C., and further preferably 150° C. to 280° C. The distance between an upper electrode and a lower electrode of the plasma CVD apparatus is set to a distance which allows generation of plasma. By newly generating the mixed phase grains of the second microcrystalline silicon film in spaces between the mixed phase grains of the first microcrystalline silicon film, the size of the mixed phase grains is reduced. Therefore, it is preferable that the frequency of generation of the mixed phase grains of the second microcrystalline silicon film is lower than that of the mixed phase grains of the first microcrystalline silicon film.

In the case where a rare gas such as helium, argon, neon, krypton, or xenon is mixed into the source gas of the second microcrystalline silicon film 59, the crystallinity of the second microcrystalline silicon film 59 can be improved in a manner similar to that of the first microcrystalline silicon film 57.

The condition for generating plasma by glow discharge at the time of forming the first microcrystalline silicon film 57 can be employed as appropriate for the second microcrystalline silicon film 59. In the case where the condition for generating plasma by glow discharge at the time of forming the first microcrystalline silicon film 57 and that at the time of forming the second microcrystalline silicon film 59 are the same, throughput can be increased; however, they may be different from each other.

Since the density of mixed phase grains in the microcrystalline silicon film depends on the density of the mixed phase grains 57a in the first microcrystalline silicon film 57, the density of the mixed phase grains 57a in the first microcrystalline silicon film 57 is preferably more than or equal to $100/\mu m^2$ and less than or equal to $10000/\mu m^2$, and further preferably more than or equal to $500/\mu m^2$ and less than or equal to $2500/\mu m^2$. When the density of the mixed phase grains 57a in the first microcrystalline silicon film 57 is within the above-described range, the density of the mixed phase gains 57a is low and the mixed phase grains 57a are dispersed; accordingly, the size of the mixed phase grains of the microcrystalline silicon film can be increased.

In this embodiment, by stacking the first microcrystalline silicon film 57 and the second microcrystalline silicon film 59, the microcrystalline silicon film having high crystallinity in which there is no space between the mixed phase grains can be formed. Note that the second microcrystalline silicon film 59 is a film which has low adhesiveness to the insulating film 55 and has a high field-effect mobility as compared to the first microcrystalline silicon film 57. The density of the microcrystalline silicon film is higher than 1.9 g/cm$^3$ and lower than or equal to 2.3 g/cm$^3$, which is closer to the density of normal single crystal silicon (2.35 g/cm$^3$); thus, the mixed phase grains are densely packed in the microcrystalline silicon film. The resistivity of the microcrystalline silicon film is higher than or equal to $1.0 \times 10^5$ Ω·cm and lower than or equal to $1.0 \times 10^8$ Ω·cm, preferably higher than or equal to $5 \times 10^6$ Ω·cm and lower than or equal to $5.0 \times 10^7$ Ω·cm. The activation energy of conductivity of the microcrystalline silicon film in the state where voltage is not applied is 0.5 eV to 0.6 eV and the microcrystalline silicon film is an i-type semiconductor.

The first microcrystalline silicon film 57 and the second microcrystalline silicon film 59 are formed of microcrystalline silicon. Note that microcrystalline silicon is a semiconductor having an intermediate structure between an amorphous structure and a crystalline structure (including single crystal and polycrystal). Microcrystalline silicon is a semiconductor having a third state that is stable in terms of free energy and is a crystalline semiconductor having short-range order and lattice distortion, in which columnar or needle-like mixed phase grains having a grain size of 2 nm to 200 nm, preferably 10 nm to 80 nm, further preferably 20 nm to 50 nm, still further preferably 25 nm to 33 nm have grown in a direction normal to the substrate surface. Therefore, there is a case in which a crystal grain boundary is formed at the interface between the columnar or needle-like mixed phase grains. Note that the grain size of a mixed phase grain here means a maximum diameter of a mixed phase grain in a plane parallel to the substrate surface.

The Raman spectrum of microcrystalline silicon is shifted to a smaller wavenumber region than 520 cm$^{-1}$ which represents single crystal silicon. That is, the peak of the Raman spectrum of the microcrystalline silicon exists between 520 cm$^{-1}$ which represents single crystal silicon and 480 cm$^{-1}$ which represents amorphous silicon. Microcrystalline silicon includes at least 1 at. % or more of hydrogen or halogen to terminate a dangling bond. Moreover, the microcrystalline silicon may contain a rare gas element such as helium, argon, krypton, or neon to further promote lattice distortion, so that stability is increased and favorable microcrystalline silicon can be obtained. Such microcrystalline silicon is disclosed in, for example, U.S. Pat. No. 4,409,134.

In this embodiment, by reducing spaces between mixed phase grains, a microcrystalline silicon film having high crystallinity can be formed.

(Embodiment 2)

In this embodiment, a manufacturing method of a microcrystalline silicon film having higher crystallinity than the microcrystalline silicon film of Embodiment 1 will be described with reference to FIGS. 1A and 1B and FIG. 2.

In a manner similar to that of Embodiment 1, a first microcrystalline silicon film 57 and a second microcrystalline silicon film 59 are formed through the process of FIGS. 1A and 1B.

Figure 2:
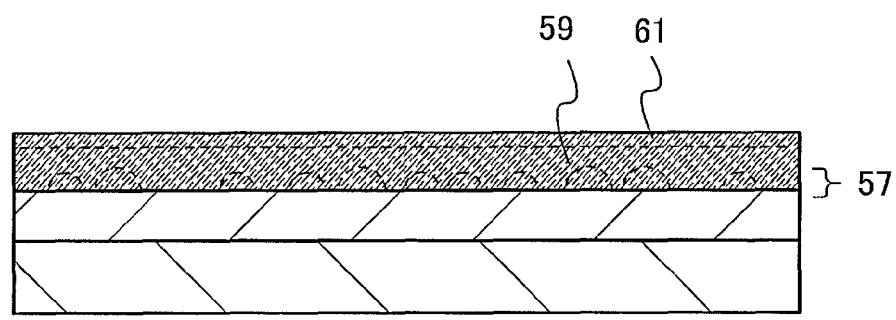
FIG. 2 is a cross-sectional view illustrating a manufacturing method of a microcrystalline silicon film having high crystallinity according to an embodiment of the present invention.

Next, as illustrated in FIG. 2, a third microcrystalline silicon film 61 is formed over the second microcrystalline silicon film 59.

The third microcrystalline silicon film 61 is formed in a treatment chamber of the plasma CVD apparatus, using plasma generated by glow discharge with the use of a mixture of a deposition gas containing silicon and hydrogen as a source gas under a third condition. Alternatively, the third microcrystalline silicon film 61 may be formed using plasma generated by glow discharge with the use of a mixture of a deposition gas containing silicon, hydrogen, and a rare gas such as helium, neon, argon, krypton, or xenon as a source gas under the third condition. Here, the third microcrystalline silicon film is formed under the third condition in which the deposition gas containing silicon is diluted with hydrogen by setting the ratio of the flow rate of hydrogen to the flow rate of the deposition gas at a ratio higher than that in the second condition and the pressure inside the treatment chamber is set higher than or equal to 1333 Pa and lower than or equal to 13332 Pa (higher than or equal to 10 Torr and lower than or equal to 100 Torr) in a manner similar to that of the second condition. The deposition temperature at this time is preferably from room temperature to 300° C., and further preferably 150° C. to 280° C.

By setting the ratio of the flow rate of hydrogen to the flow rate of the deposition gas containing silicon at a ratio higher than that in the second condition, the crystallinity of the third microcrystalline silicon film 61 can be further increased, and a microcrystalline silicon film whose surface crystallinity is higher than that of the microcrystalline silicon film in Embodiment 1 can be formed.

(Embodiment 3)

In this embodiment, a manufacturing method of a thin film transistor formed in a semiconductor device that is an embodiment of the present invention will be described with reference to FIGS. 3A to 3D, FIGS. 4A and 4B, and FIGS. 5A to 5C. Note that an n-channel thin film transistor has higher carrier mobility than a p-channel thin film transistor. In this embodiment, a manufacturing method of an n-channel thin film transistor will be described.

Figure 3A:
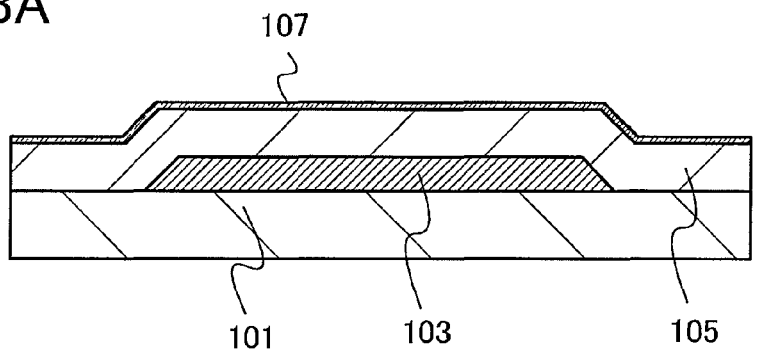
FIGS. 3A to 3D are cross-sectional views illustrating a manufacturing method of a semiconductor device according to an embodiment of the present invention.

As illustrated in FIG. 3A, a gate electrode 103 is formed over a substrate 101. Then, a gate insulating film 105 which covers the gate electrode 103 (also referred to as a first gate electrode) is formed. A first microcrystalline silicon film 107 is formed over the gate insulating film 105.

As the substrate 101, the substrate 51 described in Embodiment 1 can be used as appropriate.

The gate electrode 103 can be formed in the following manner: a conductive film is formed over the substrate 101 by a sputtering method or a vacuum evaporation method using the any metal material of Mo, Ti, Cr, Ta, W, Al, Cu, Nd, Sc, or Ni; a mask is formed over the conductive film by a photolithography method; and the conductive film is etched using the mask. In order to improve adhesion between the gate electrode 103 and the substrate 101, a nitride film of any of the above-described metal materials may be provided between the substrate 101 and the gate electrode 103. In this embodiment, a conductive film is formed over the substrate 101 and etched using a resist mask formed by a photolithography method.

Note that side surfaces of the gate electrode 103 are preferably tapered. This is because an insulating film, a silicon film, and a wiring formed over the gate electrode 103 in later steps can be prevented from being cut at a step portion of the gate electrode 103. In order to taper the side surfaces of the gate electrode 103, etching may be performed while the resist mask is made to recede.

The gate insulating film 105 can be formed using the insulating film 55 described in Embodiment 1 as appropriate.

The gate insulating film 105 can be formed by a CVD method, a sputtering method, or the like.

Note that in the case where the gate insulating film 105 is formed using a silicon nitride film or a silicon nitride oxide film, the threshold voltage of the thin film transistor shifts in the negative direction; therefore, oxygen plasma treatment in which a surface of the gate insulating film 105 is exposed to plasma of an oxidizing gas atmosphere may be performed. The oxidizing gas atmosphere is an atmosphere containing at least one of oxygen, ozone, dinitrogen monoxide, or the like. By the oxygen plasma treatment, a normally-off transistor can be manufactured.

The first microcrystalline silicon film 107 can be formed under a first condition which allows the density of mixed phase grains to be low and the crystallinity of the mixed phase grains to be high, in a manner similar to that of the first microcrystalline silicon film 57 described in Embodiment 1.

In the case where a rare gas such as helium, argon, neon, krypton, or xenon is mixed into the source gas of the first microcrystalline silicon film 107, the crystallinity of the first microcrystalline silicon film 107 can be increased. Accordingly, the on-state current and the field-effect mobility of the thin film transistor are increased and the throughput of the thin film transistor can also be increased.

Figure 3B:
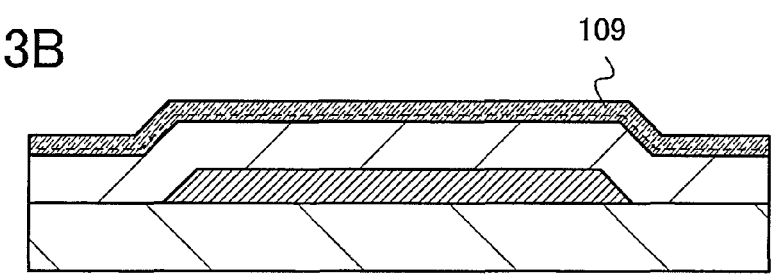

Next, as illustrated in FIG. 3B, a second microcrystalline silicon film 109 is formed over the first microcrystalline silicon film 107. The second microcrystalline silicon film 109 can be formed under a second condition which allows the second microcrystalline silicon film 109 to fill the space between the mixed phase grains of the first microcrystalline silicon film 107 and also promotes crystal growth, in a manner similar to that of the second microcrystalline silicon film 59 described in Embodiment 1.

In the case where a rare gas such as helium, argon, neon, krypton, or xenon is mixed into the source gas of the second microcrystalline silicon film 109, the crystallinity of the second microcrystalline silicon film 109 can be increased in a manner similar to that of the first microcrystalline silicon film 107. Accordingly, the on-state current and the field-effect mobility of the thin film transistor are increased and the throughput of the thin film transistor can also be increased.

Figure 3C:
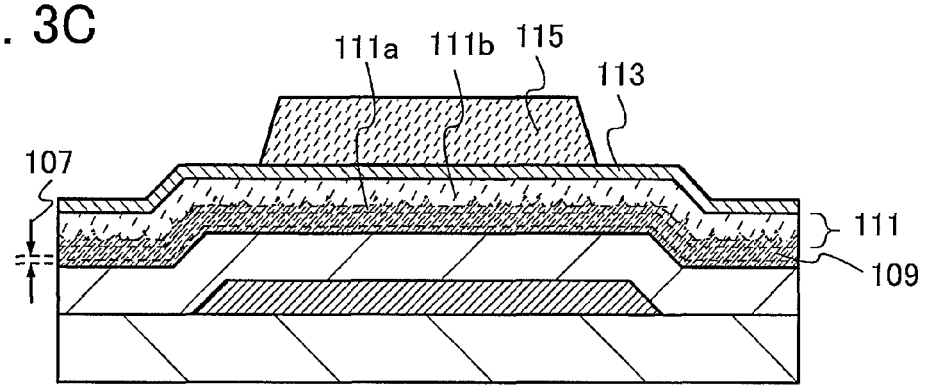

Next, as illustrated in FIG. 3C, a silicon film 111 is formed over the second microcrystalline silicon film 109. The silicon film 111 includes a microcrystalline silicon region 111a and an amorphous silicon region 111b. Then, an impurity silicon film 113 is formed over the silicon film 111, and a resist mask 115 is formed over the impurity silicon film 113.

The silicon film 111 including the microcrystalline silicon region 111a and the amorphous silicon region 111b can be formed under a condition which causes partial crystal growth using the second microcrystalline silicon film 109 as a seed crystal (a condition by which the crystal growth is reduced).

The silicon film 111 is formed in a treatment chamber of the plasma CVD apparatus, using plasma generated by glow discharge with the use of a mixture of a deposition gas containing silicon, hydrogen, and a gas containing nitrogen. As examples of the gas containing nitrogen, there are ammonia, nitrogen, nitrogen fluoride, nitrogen chloride, and the like. Generation of plasma by glow discharge can be performed in a manner similar to that of the first microcrystalline silicon film 107.

In that case, the ratio of the flow rate of hydrogen to the flow rate of the deposition gas containing silicon is set to a ratio for forming a microcrystalline silicon film in a manner similar to that in forming the first microcrystalline silicon film 107 or the second microcrystalline silicon film 109, and the gas containing nitrogen is used as a source gas, whereby the degree of crystal growth can be reduced as compared to those under the deposition conditions for the first microcrystalline silicon film 107 and the second microcrystalline silicon film 109. Specifically, at an early stage of deposition of the silicon film 111, the gas containing nitrogen included in the source gas partly suppresses the crystal growth, so that a conical microcrystalline silicon region or a pyramidal microcrystalline silicon region grows and an amorphous silicon region is formed. Further, at a middle stage or a later stage of the deposition, crystal growth of the conical or pyramidal microcrystalline silicon region stops, and only an amorphous silicon region is deposited. Accordingly, in the silicon film 111, the microcrystalline silicon region 111a and the amorphous semiconductor region 111b which is formed using a well-ordered silicon film having fewer defects and a steep tail of a level at a valence band edge, can be formed.

Here, a typical example of a condition for forming the silicon film 111 is as follows: the flow rate of hydrogen is 10 times to 2000 times, preferably 10 times to 200 times that of the deposition gas containing silicon. Note that in a typical example of a condition for forming a normal amorphous silicon film, the flow rate of hydrogen is 0 times to 5 times that of the deposition gas containing silicon.

In the case where a rare gas such as helium, neon, argon, xenon, or krypton is introduced into the source gas of the silicon film 111, the deposition rate can be increased.

It is preferable for the silicon film 111 to have a thickness of 50 nm to 350 nm, and further preferable for the silicon film 111 to have a thickness of 120 nm to 250 nm.

Figure 4A:
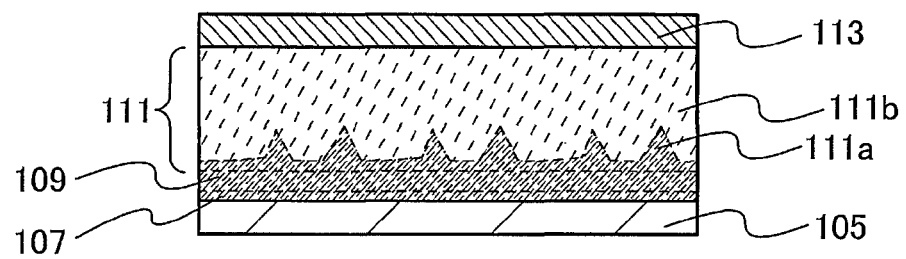
FIGS. 4A and 4B are cross-sectional views illustrating a manufacturing method of a semiconductor device according to an embodiment of the present invention.
Figure 4B:
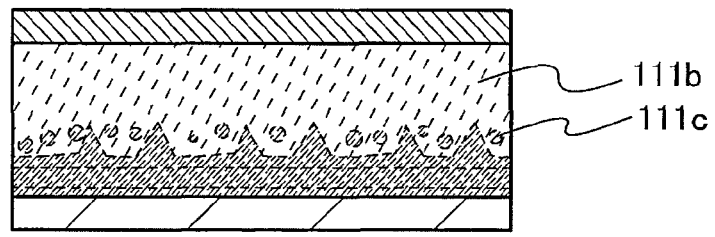

FIGS. 4A and 4B are enlarged views of the portion between the gate insulating film 105 and the impurity silicon film 113 illustrated in FIG. 3C.

As illustrated in FIG. 4A, the microcrystalline silicon region 111a in the silicon film 111 has a projection and a depression; and the projection has a conical or pyramidal shape whose width decreases from the gate insulating film 105 side toward the amorphous silicon region 111b side (a tip of the projection has an acute angle). Alternatively, the microcrystalline silicon region 111a may have a projecting (inverted conical or pyramidal) shape whose width increases from the gate insulating film 105 side toward the amorphous semiconductor region 111b side.

By setting the thickness of the first microcrystalline silicon film 107, the second microcrystalline silicon film 109, and the microcrystalline silicon region 111a, that is, the distance from the interface between the first microcrystalline silicon film 107 and the gate insulating film 105 to the tip of the projection of the microcrystalline silicon region 111a to 5 nm or more and 310 nm or less, the off-state current of the thin film transistor can be reduced.

Further, in order to improve the crystallinity of the microcrystalline silicon region 111a, it is preferable that the concentration of oxygen contained in the silicon film 111, which is measured by secondary ion mass spectrometry, be less than $1 \times 10^{18}$ atoms/cm$^3$. The nitrogen concentration profile of the semiconductor film 111 that is measured by secondary ion mass spectrometry has a peak concentration greater than or equal to $1 \times 10^{20}$ atoms/cm$^3$ and less than or equal to $1 \times 10^{21}$ atoms/cm$^3$, preferably greater than or equal to $2 \times 10^{20}$ atoms/cm$^3$ and less than or equal to $1 \times 10^{21}$ atoms/cm$^3$.

The amorphous silicon region 111b is formed of an amorphous semiconductor containing nitrogen. The nitrogen of the amorphous semiconductor containing nitrogen may exist, for example, as an NH group or an NH$_2$ group. As the amorphous semiconductor, amorphous silicon can be used.

Amorphous silicon containing nitrogen is a semiconductor having lower energy at an Urbach edge that is measured by a constant photocurrent method (CPM) or photoluminescence spectroscopy and a smaller amount of defect absorption spectrum, as compared to a conventional amorphous semiconductor. In other words, as compared to the conventional amorphous semiconductor, the amorphous silicon containing nitrogen is a well-ordered semiconductor which has few defects and whose tail of a level at a valence band edge is steep. Since the amorphous silicon containing nitrogen has a steep tail of a level at a valence band edge, the band gap is wide and tunnel current does not flow easily. Therefore, when the amorphous silicon containing nitrogen is provided between the microcrystalline silicon region 111a and the impurity silicon film 113, the off-state current of the thin film transistor can be reduced. In addition, by provision of the amorphous silicon containing nitrogen, the on-state current and the field-effect mobility can be increased.

Further, the peak region of a spectrum of the amorphous silicon containing nitrogen that is measured by low-temperature photoluminescence spectroscopy is higher than or equal to 1.31 eV and lower than or equal to 1.39 eV. Note that the peak region of a spectrum of microcrystalline silicon, which is measured by low-temperature photoluminescence spectroscopy is higher than or equal to 0.98 eV and lower than or equal to 1.02 eV. Accordingly, the amorphous silicon containing nitrogen is different from microcrystalline silicon.

The microcrystalline silicon region 111a, as well as the amorphous silicon region 111b, may include a NH group or an $NH_2$ group.

Further, as illustrated in FIG. 4B, a silicon crystal grain 111c whose grain size is greater than or equal to 1 nm and less than or equal to 10 nm, preferably greater than or equal to 1 nm and less than or equal to 5 nm may be included in the amorphous silicon region 111b, so that the on-state current and the filed-effect mobility can be further increased.

The microcrystalline silicon having a projecting (conical or pyramidal) shape whose width decreases from the gate insulating film 105 toward the amorphous silicon region 111b is formed in the following manner: after the second microcrystalline silicon film is formed under the deposition condition for microcrystalline silicon, crystal growth is caused on such a condition that the crystal growth is reduced, and amorphous silicon is deposited.

Since the microcrystalline silicon region 111a in the silicon film 111 has the conical or pyramidal shape or the inverted conical or pyramidal shape, resistance in a vertical direction (film thickness direction) of when voltage is applied between a source and drain electrodes in an on state, i.e., the resistance of the silicon film 111 can be lowered. Further, tunnel current does not easily flow since amorphous silicon containing nitrogen is provided between the microcrystalline silicon region 111a and the impurity silicon film 113. Amorphous silicon containing nitrogen is a well-ordered semiconductor having few defects and a steep tail of a level at a valence band edge. Thus, in the thin film transistor described in this embodiment, the on-state current and the field-effect mobility can be increased and the off-state current can be reduced.

The impurity silicon film 113 is formed using amorphous silicon to which phosphorus is added, microcrystalline silicon to which phosphorus is added, or the like. A structure in which amorphous silicon to which phosphorus is added and microcrystalline silicon to which phosphorus is added are stacked can also be employed. In the case of forming a p-channel thin film transistor as a thin film transistor, the impurity silicon film 113 is formed using microcrystalline silicon to which boron is added, amorphous silicon to which boron is added, or the like.

The impurity silicon film 113 is formed in a treatment chamber of the plasma CVD apparatus, using plasma generated by glow discharge with the use of a mixture of a deposition gas containing silicon, hydrogen, and phosphine (diluted with hydrogen or silane) as a source gas. The deposition gas containing silicon is diluted with hydrogen, in formation of amorphous silicon to which phosphorus is added or microcrystalline silicon to which phosphorus is added. In the case of manufacturing a p-type thin film transistor, the impurity silicon film 113 may be formed using plasma generated by glow discharge using diborane instead of phosphine.

The resist mask 115 can be formed by a photolithography step.

Figure 3D:
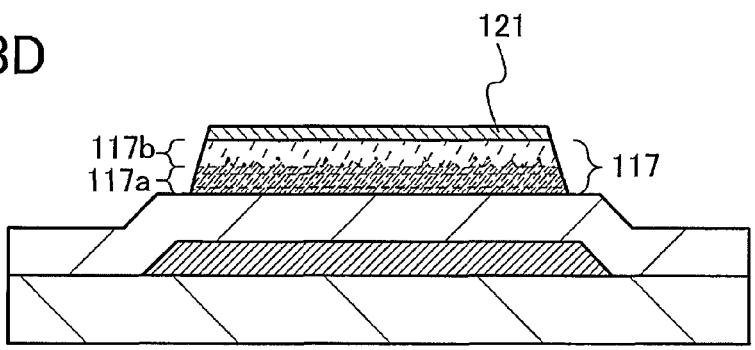

Next, as illustrated in FIG. 3D, the first microcrystalline silicon film 107, the second microcrystalline silicon film 109, the silicon film 111, and the impurity silicon film 113 are etched using the resist mask 115. By this step, the first microcrystalline silicon film 107, the second microcrystalline silicon film 109, the silicon film 111, and the impurity silicon film 113 are divided into elements, so that a silicon stacked body 117 and an impurity silicon film 121 are formed. The silicon stacked body 117 is formed including part of the first microcrystalline silicon film 107, part of the second microcrystalline silicon film 109, and part of the silicon film 111. The silicon stacked body 117 is constituted of a microcrystalline silicon region 117a which includes part of the first microcrystalline silicon film 107, part of the second microcrystalline silicon film 109, and part of the microcrystalline silicon region of the silicon film 111 and an amorphous silicon region 117b which includes part of the amorphous silicon region of the silicon film 111. Then, the resist mask 115 is removed.

Figure 5A:
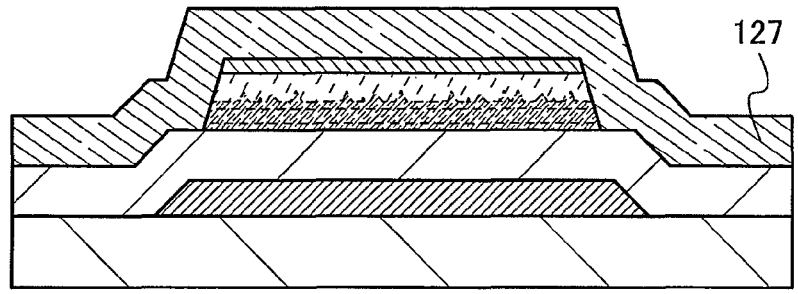
FIGS. 5A to 5C are cross-sectional views illustrating a manufacturing method of a semiconductor device according to an embodiment of the present invention.

Then, as illustrated in FIG. 5A, a conductive film 127 is formed over the impurity silicon film 121. The conductive film 127 is formed by a CVD method, a sputtering method, or a vacuum evaporation method.

Figure 5B:
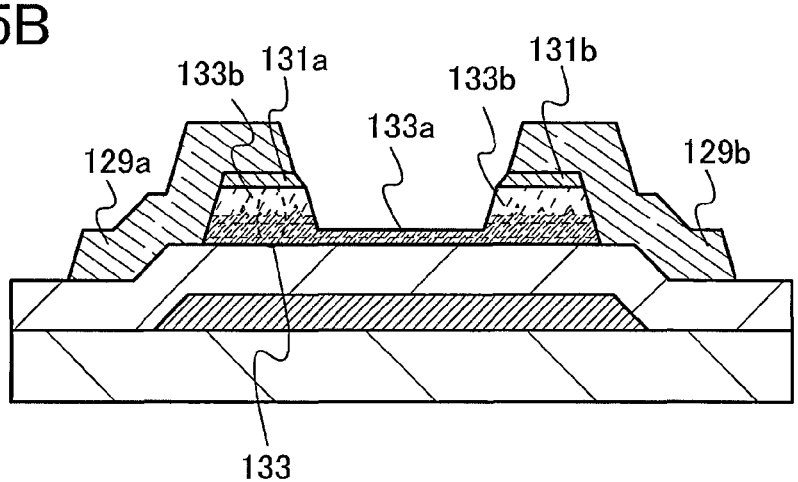

Next, as illustrated in FIG. 5B, wirings 129a and 129b functioning as a source electrode and a drain electrode are formed by forming a resist mask (not illustrated) by a photolithography step and etching the conductive film 127 with the use of the resist mask. The etching of the conductive film 127 may be either dry etching or wet etching. Note that one of the wirings 129a and 129b functions as a signal line as well as a source electrode or a drain electrode. However, without limitation thereto, a signal line may be provided separately from the source and drain electrodes.

Next, the impurity silicon film 121 and the silicon stacked body 117 are partly etched, so that a pair of impurity silicon films 131a and 131b functioning as a source and drain regions are formed. A silicon stacked body 133 including a microcrystalline silicon region 133a and a pair of amorphous silicon regions 133b is formed. At this time, the silicon stacked body 117 is etched so as to expose the microcrystalline silicon region 133a, so that the silicon stacked body 133 is formed in which the microcrystalline silicon region 133a and the amorphous silicon regions 133b are stacked in regions covered with the wirings 129a and 129b and the microcrystalline silicon region 133a is exposed in a region not covered with the wirings 129a and 129b and overlapping with the gate electrode.

Next, dry etching may be performed. As the condition for the dry etching, a condition by which the exposed microcrystalline silicon region 133a and the exposed amorphous silicon regions 133b are not damaged and in which the etching rate of the microcrystalline silicon region 133a and the amorphous silicon regions 133b is low is used. That is, a condition by which surfaces of the exposed microcrystalline silicon region 133a and the exposed amorphous silicon regions 133b are hardly damaged and by which the thicknesses of the exposed microcrystalline silicon region 133a and the exposed amorphous silicon regions 133b are hardly reduced is used. As an etching gas, $Cl_2$, $CF_4$, $N_2$, or the like is typically used.

Then, plasma treatment may be performed on the surfaces of the microcrystalline silicon region 133a and the amorphous silicon regions 133b. By the plasma treatment, impurities such as a residue existing on the exposed microcrystalline silicon region 133a and the exposed amorphous silicon regions 133b can be removed and defects of the microcrystalline silicon region 133a can be reduced. Further by the plasma treatment, insulation between the source region and the drain region can be ensured, and thus, in a completed thin film transistor, off-state current can be reduced, and variation in electric characteristics can be reduced.

Through the above-described process, a single-gate thin film transistor can be manufactured. A single-gate thin film transistor with low off-state current, high on-state current, and high field-effect mobility can be manufactured with high productivity. Note that in this embodiment, a thin film transistor whose gate electrode is located below a channel region has been described as a semiconductor device according to an embodiment of the present invention; however, the present invention may also be applied to a dual-gate thin film transistor whose back gate electrode is located above a channel region as a semiconductor device according to an embodiment of the present invention.

Next, an insulating film 137 is formed over the silicon stacked body 133 and the wirings 129a and 129b. The insulating film 137 can be formed in a manner similar to that for the gate insulating film 105.

Next, an opening (not illustrated) is formed in the insulating film 137 with the use of a resist mask formed by a photolithography step. A back gate electrode 139 is formed over the insulating film 137 (see FIG. 5C). Through the above-described process, a dual-gate thin film transistor can be manufactured.

The back gate electrode 139 can be formed in a manner similar to that of the wirings 129a and 129b. Alternatively, the back gate electrode 139 can be formed using a light-transmitting conductive material.

The back gate electrode 139 can be formed in parallel to the gate electrode 103. In this case, each of potential applied to the back gate electrode 139 and potential applied to the gate electrode 103 can be controlled independently. Thus, the threshold voltage of the thin film transistor can be controlled. Further, regions in which carriers flow, that is, channel regions, are formed on the gate insulating film 105 side and on the insulating film 137 side in the microcrystalline silicon region; thus, the on-state current of the thin film transistor can be increased.

The back gate electrode 139 can be connected to the gate electrode 103. That is, the gate electrode 103 and the back gate electrode 139 can be connected through an opening (not illustrated) formed in the gate insulating film 105 and the insulating film 137. In this case, potential applied to the back gate electrode 139 and potential applied to the gate electrode 103 are equal. As a result, in the silicon film, regions in which carriers flow, that is, channel regions are formed on the gate insulating film 105 side and on the insulating film 137 side in the microcrystalline silicon region; thus, the on-state current of the thin film transistor can be increased.

Further alternatively, the back gate electrode 139 is not necessarily connected to the gate electrode 103 and may be in a floating state. In that case, channel regions are formed on the gate insulating film 105 side and on the insulating film 137 side in the microcrystalline silicon region without a potential applied to the back gate electrode 139; thus, the on-state current of the thin film transistor can be increased.

Further, the back gate electrode 139 may overlap with the wirings 129a and 129b with the insulating film 137 provided therebetween.

Through the above-described process, a single-gate thin film transistor and a dual-gate thin film transistor having high on-state current, high field-effect mobility, and low off-state current can be manufactured. In the case where, after exposing a gate insulating film to oxygen plasma, an i-type microcrystalline silicon film having an activation energy of 0.5 eV to 0.6 eV is formed for a channel region as in Embodiment 1, a thin film transistor which is normally off as well as having the above-described effects can be manufactured.

(Embodiment 4)

Figure 6:
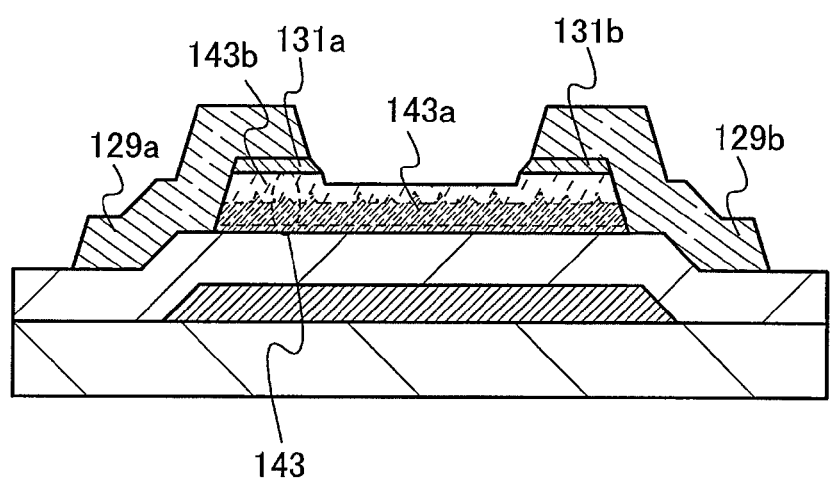
FIG. 6 is a cross-sectional view illustrating a manufacturing method of a thin film transistor formed in a semiconductor device of an embodiment of the present invention.

In this embodiment, a manufacturing method of a thin film transistor formed in the semiconductor device that is an embodiment of the present invention will be described with reference to FIG. 6. FIG. 6 corresponds to the step illustrated in FIG. 5B.

In a manner similar to that of Embodiment 3, a conductive film 127 is formed through the process of FIGS. 3A to 3D and FIG. 5A.

Then, as illustrated in FIG. 6, wirings 129a and 129b are formed and an impurity silicon film 121 and a silicon stacked body 117 are partly etched, so that a pair of impurity silicon films 131a and 131b serving as a source region and a drain region are formed in a manner similar to that of Embodiment 3. A silicon stacked body 143 including a microcrystalline silicon region 143a and an amorphous silicon region 143b is formed. At this time, the silicon stacked body 117 is etched so as to expose the amorphous region 143b, so that the silicon stacked body 143 is formed in which the microcrystalline silicon region 143a and the amorphous silicon region 143b are stacked in regions covered with the wirings 129a and 129b and the microcrystalline silicon region 143a is not exposed and the amorphous silicon region 143b is exposed in a region not covered with the wirings 129a and 129b and overlapping with the gate electrode. Note that the etching amount of the silicon stacked body 117 is smaller than that in the case of FIG. 5B.

A later process is similar to that of Embodiment 3. Through the above-described process, a single-gate thin film transistor can be manufactured. Since the back channel side of the thin film transistor is amorphous, the off-state current can be reduced as compared to the thin film transistor illustrated in FIG. 5B.

Figure 5C:
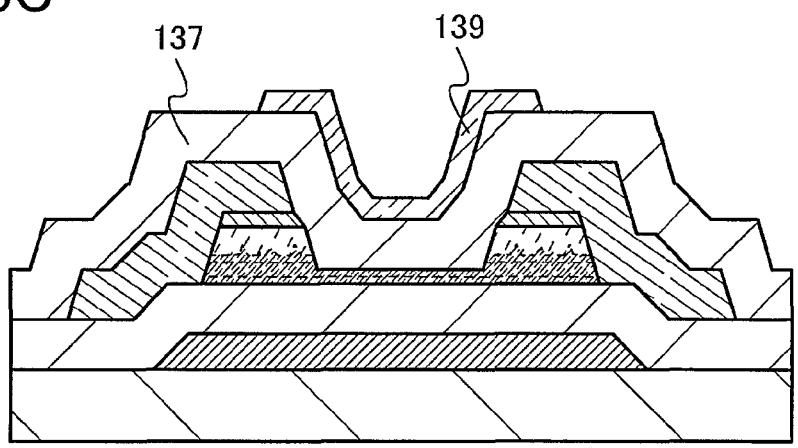

Further in this embodiment, after the step illustrated in FIG. 6, a back gate electrode 139 may be formed over an insulating film 137 as in the step illustrated in FIG. 5C.

EXAMPLE

Example 1

In this example, electric characteristics of the following thin film transistors will be described: a thin film transistor whose microcrystalline silicon film is formed under only the first condition described in Embodiment 1 (Sample 1), a thin film transistor whose microcrystalline silicon film is formed under only the second condition described in Embodiment 1 (Sample 2), and a thin film transistor in which a first microcrystalline silicon film formed under the first condition and a second microcrystalline silicon film formed under the second condition are stacked (Sample 3).

A manufacturing method of the thin film transistors of this example will be described with reference to FIGS. 3A to 3D and FIGS. 5A to 5C.

First, a base insulating film (not illustrated here) was formed over a substrate 101, and a gate electrode 103 was formed over the base insulating film.

Here, a glass substrate (EAGLE XG manufactured by Corning Incorporated) was used as the substrate 101.

The gate electrode 103 had a structure in which an aluminum layer was sandwiched between titanium layers. Specifically, first, a first titanium film with a thickness of 50 nm was formed over the base insulating film by sputtering a titanium target with argon ions. At this time, the flow rate of argon which was introduced into a treatment chamber was 20 sccm and the pressure inside the treatment chamber was set at 0.1 Pa. Then, an aluminum target was sputtered with argon ions, so that an aluminum film with a thickness of 100 nm was formed. At this time, the flow rate of argon which was introduced into the treatment chamber was 50 sccm and the pressure inside the treatment chamber was set at 0.4 Pa. Furthermore, a titanium target was sputtered with argon ions, so that a second titanium film with a thickness of 120 nm was formed. At this time, the flow rate of argon which was introduced into the treatment chamber was 20 sccm and the pressure inside the treatment chamber was set at 0.1 Pa.

After that, a resist was applied over the second titanium film and was irradiated with light with the use of a first photomask and developed to form a resist mask.

Next, etching was performed using the resist mask, so that the gate electrode 103 was formed. Here, two-step etching was conducted using an inductively coupled plasma (ICP) apparatus in the following manner. The first etching was performed under a condition where the ICP power was 600 W, the bias power was 250 W, boron trichloride was introduced at a flow rate of. 60 sccm and chlorine was introduced at a flow rate of 20 sccm as an etching gas, and the pressure inside a treatment chamber was 1.2 Pa. After that, the second etching was performed under a condition where the ICP power was 500 W, the bias power was 50 W, the pressure was 2.0 Pa, carbon fluoride was introduced at a flow rate of 80 sccm as an etching gas, and the pressure inside the treatment chamber was 2.0 Pa. After that, the resist mask was removed.

Next, a gate insulating film 105 was formed over the gate electrode 103 and the base insulating film.

The gate insulating film 105 was formed using a silicon nitride film. The silicon nitride film was formed with a thickness of 300 nm by a plasma CVD method.

The silicon nitride film was formed by plasma discharge performed under the following condition: silane, hydrogen, nitrogen, and ammonia were introduced as a source gas at flow rates of 15 sccm, 200 sccm, 180 sccm, and 500 sccm; the pressure of a treatment chamber was 100 Pa; the substrate temperature was 250° C.; the RF power source frequency was 13.56 MHz; and power of an RF power source was 200 W.

Next, plasma treatment was performed on the gate insulating film 105. Here, plasma treatment for Sample 1 was performed at 300 W under a condition in which hydrogen was introduced at a flow rate of 400 sccm and the pressure inside a treatment chamber was stabilized at 60 Pa. Then, dinitrogen monoxide ($N_2O$) was introduced at a flow rate of 400 sccm and the pressure inside the treatment chamber was stabilized at 60 Pa, and plasma discharge was performed at 300 W. Plasma treatment for Sample 2 and Sample 3 was performed by plasma discharge at 300 W under a condition in which dinitrogen monoxide was introduced at a flow rate of 400 sccm and the pressure inside a treatment chamber was stabilized at 60 Pa. Note that the above-described plasma treatment was performed using a parallel-plate plasma apparatus, with the upper electrode temperature and the lower electrode temperature set at 250° C. and 290° C. respectively.

Next, a microcrystalline silicon film was formed over the gate insulating film 105.

Here, as the microcrystalline silicon film of Sample 1, a microcrystalline silicon film with a thickness of 30 nm was formed under only the first condition. For Sample 2, a microcrystalline silicon film with a thickness of 30 nm was formed under only the second condition. Further for Sample 3, after forming a first microcrystalline silicon film with a thickness of 5 nm under the first condition, a second microcrystalline silicon film with a thickness of 85 nm was formed under the second condition.

The first condition for depositing the microcrystalline silicon film was a condition in which plasma discharge was performed in a plasma CVD method by introducing silane, hydrogen, and argon as a source gas at flow rates of 4 sccm, 750 sccm, and 750 sccm respectively, and setting the pressure inside a treatment chamber at 532 Pa, the RF power source frequency at 13.56 MHz, and the power of the RF power at 150 W. Note that here, the microcrystalline silicon film was deposited using a parallel-plate plasma apparatus, with the upper electrode temperature and the lower electrode temperature set at 250° C. and 290° C. respectively.

The second condition for depositing the microcrystalline silicon film was a condition in which plasma discharge was performed in a plasma CVD method by introducing silane, hydrogen, and argon as a source gas at flow rates of 1.8 sccm, 750 sccm, and 750 sccm respectively, and setting the pressure inside a treatment chamber at 5000 Pa and the RF power source frequency at 13.56 MHz.

Next, a silicon film 111 was formed over the microcrystalline silicon film, and an impurity silicon film 113 was formed over the silicon film 111. The silicon film 111 and the impurity silicon film 113 were stacked by a plasma CVD method.

As the deposition condition of the silicon film 111 for Sample 1 and Sample 2, the thickness of the silicon film 111 was 175 nm. In Sample 3, a silicon film with a thickness of 80 nm was formed. The deposition condition at this time was a condition in which plasma discharge was performed by introducing silane, 1000 ppm ammonia (diluted with hydrogen), hydrogen, and argon as a source gas at flow rates of 20 sccm, 50 sccm, 700 sccm, and 750 sccm respectively, and setting the pressure inside a treatment chamber at 350 Pa, the RF power source frequency at 13.56 MHz, and the power of the RF power at 60 W. Note that here, the silicon film 111 was deposited using the parallel-plate plasma apparatus, with the upper electrode temperature and the lower electrode temperature set at 250° C. and 290° C. respectively.

As the impurity silicon film 113, an amorphous silicon film with a thickness of 50 nm to which phosphorus was added was formed. The deposition condition at this time was a condition in which plasma discharge was performed by introducing silane, 0.5% phosphine (diluted with hydrogen), and hydrogen as a source gas at flow rates of 20 sccm, 170 sccm, and 100 sccm respectively, and setting the pressure inside a treatment chamber at 170 Pa, the RF power source frequency at 13.56 MHz, and the power of the RF power at 60 W. Note that here, the impurity silicon film was deposited using the parallel-plate plasma apparatus, with the upper electrode temperature and the lower electrode temperature set at 250° C. and 290° C. respectively.

Next, a resist was applied over the impurity silicon film 113 and was irradiated with light with the use of a second photomask and developed to form a resist mask 115. The state at this time is illustrated in FIG. 3C.

Next, the microcrystalline silicon film, the silicon film 111, and the impurity silicon film 113 were etched with the use of the resist mask 115, so that a silicon stacked body 117 including a microcrystalline silicon region 117a and an amorphous silicon region 117b, and an impurity silicon film 121 were formed.

Here, the etching was performed using an ICP apparatus under a condition in which the ICP power was 1000 W, the bias power was 80 W, chlorine was introduced as an etching gas at a flow rate of 100 sccm, and the pressure inside a treatment chamber was 1.51 Pa. After that, the resist mask 115 was removed (see FIG. 3D).

Next, as illustrated in FIG. 5A, a conductive film 127 was formed over the gate insulating film 105 so as to cover the silicon stacked body 117 and the impurity silicon film 121.

Here, the conductive film 127 had a structure in which an aluminum layer was sandwiched between titanium layers and was formed in a manner similar to that of the gate electrode 103. Note that the thicknesses of the first titanium film, the aluminum film, and the second titanium film were 50 nm, 200 nm, and 50 nm, respectively.

Next, a resist was applied over the conductive film 127 and was irradiated with light with the use of a third photomask and developed to form a resist mask (not illustrated). Dry etching was performed on the conductive film 127 with the use of the resist mask, so that wirings 129a and 129b were formed. Then, the impurity silicon film 121 was dry etched, so that a pair of impurity silicon films 131a and 131b serving as a source region and a drain region were formed. Further, the silicon stacked body 117 was partly etched, so that a silicon stacked body 133 including a microcrystalline silicon region 133a and a pair of amorphous silicon regions 133b was formed.

Here, the etching was performed using an ICP apparatus under a condition in which the ICP power was 450 W, the bias power was 100 W, boron chloride and chlorine were introduced as an etching gas at flow rates of 60 sccm and 100 sccm, respectively, and the pressure inside a treatment chamber was 1.9 Pa.

Note that the silicon stacked body 117 was etched 20 nm to 40 nm deep from its surface in Sample 1 and Sample 2, while the silicon stacked body 117 was etched 100 nm to 120 nm deep from its surface in Sample 3. Note that in this example, the planar shape of the wirings 129a and 129b functioning as the source electrode and drain electrode was linear.

Next, the surface of the silicon stacked body 133 was subjected to plasma treatment with carbon fluoride plasma, whereby impurities remaining on the surface of the silicon stacked body 133 were removed. Here, the plasma treatment was performed using the ICP apparatus under a condition in which the ICP power was 1000 W, the bias power was 0 W, carbon fluoride was introduced at a flow rate of 100 sccm, and the pressure inside a treatment chamber was 0.67 Pa.

Next in Sample 3, the surface of the silicon stacked body 133 was irradiated with water plasma, so that surface defects of the silicon stacked body 133 were reduced and the insulation properties of the source and drain regions were improved. Here, the silicon stacked body 133 was irradiated with plasma generated by introduction of water vapor at a flow rate of 300 sccm at an ICP power of 1800 W and a pressure of 66.5 Pa.

After that, the resist mask was removed. The state at this time of Sample 1 and Sample 2 is illustrated in FIG. 6, and that of Sample 3 is illustrated in FIG. 5B.

Next, a silicon nitride film with a thickness of 300 nm was formed as the insulating film 137. The deposition condition at this time was a condition in which plasma discharge was performed by introducing silane, ammonia, nitrogen, and hydrogen as a source gas at flow rates of 20 sccm, 220 sccm, 450 sccm, and 450 sccm respectively, and setting the pressure inside a treatment chamber at 160 Pa, the substrate temperature at 250° C., the RF power source frequency at 13.56 MHz, and the power of the RF power at 200 W.

Next, a resist was applied over the insulating film 137 and was irradiated with light with the use of a fourth photomask and developed to form a resist mask (not illustrated). With the use of the resist mask, part of the insulating film was dry etched so that the wirings 129a and 129b functioning as the source and drain electrodes were exposed. In addition, part of the insulating film 137 and part of the gate insulating film 105 were dry etched so that the gate electrode 103 was exposed. After that, the resist mask was removed.

Through the above-described process, Sample 1 and Sample 2 were manufactured.

Next, a conductive film was formed over the insulating film 137. After that, a resist was applied over the conductive film and was irradiated with light with the use of a fifth photomask and developed to form a resist mask (not illustrated). With the use of the resist mask, part of the conductive film was wet etched, so that a back gate electrode 139 was formed.

In this example, as the conductive film, a 50-nm-thick indium tin oxide was deposited by a sputtering method, and was subjected to wet-etching treatment, so that the back gate electrode 139 was formed. Although not illustrated, the back gate electrode 139 was connected to the gate electrode 103. After that, the resist mask was removed.

Through the above-described process, a dual-gate thin film transistor of Sample 3 was manufactured (see FIG. 5C).

Figure 7:
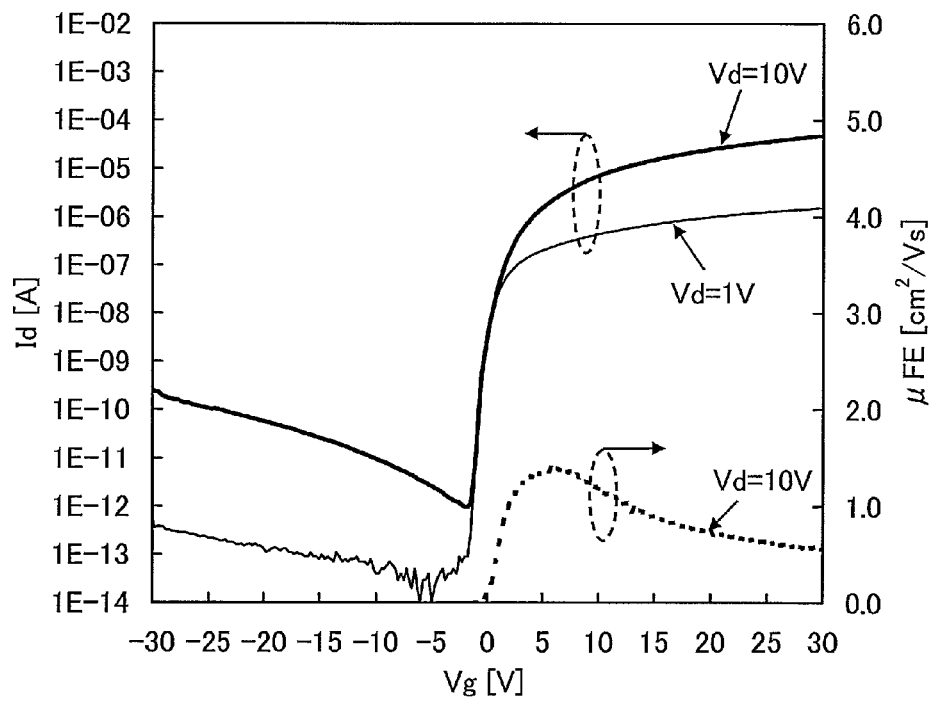
FIG. 7 shows measured electric characteristics of a thin film transistor (Sample 3)

The measured electric characteristics of the thin film transistor of Sample 3 are shown in FIG. 7. In FIG. 7, Vg is the voltage applied to the gate electrode 103. From FIG. 7, it is found that a thin film transistor having high on-state current, high field-effect mobility, and low off-state current was able to be manufactured in this example.

Next, the average value (μFE_ave) of field-effect mobilities on sixteen points and the standard deviation for each of Samples 1 to 3 are shown in Table 1.

TABLE 1

|  | μFE_ave (cm$^2$/Vs) | Standard deviation |
| --- | --- | --- |
| Sample 1 | 0.22 | 0.01 |
| Sample 2 | 0.30 | 0.15 |
| Sample 3 | 0.88 | 0.02 |

From Table 1, it can be noticed that the variation in field-effect mobility of Sample 3 is smaller than that of Sample 2. Therefore, the variation in electric characteristics of a thin film transistor can be reduced by forming a first microcrystalline silicon film under the first condition and then stacking a second microcrystalline silicon film under the second condition.

Example 2

In this example, the density of mixed phase grains in a microcrystalline silicon film formed in accordance with Embodiment 1 and the field-effect mobility of thin film transistors formed using a microcrystalline silicon film formed under a condition similar to that of the microcrystalline silicon film formed in accordance with Embodiment 1 will be described with reference to FIG. 8.

First, respective manufacturing methods of Samples 4 to 8 whose density of mixed phase grains is measured are described.

A silicon nitride film was formed over a substrate under a condition similar to that of the gate insulating film 105 of Example 1. Next, a first microcrystalline silicon film with a thickness of 5 nm was formed under the first condition described in Embodiment 1, and then a second microcrystalline silicon film with a thickness of 25 nm was stacked under the second condition described in Embodiment 1; accordingly, a microcrystalline silicon film having a total thickness of 30 nm was formed.

The first condition for depositing the first microcrystalline silicon film of Samples 4 to 8 was a condition in which plasma discharge was performed in a plasma CVD method by introducing silane, hydrogen, and argon as a source gas at the flow rate described below, a flow rate of 750 sccm, and a flow rate of 750 sccm respectively, and setting the pressure inside a treatment chamber at 532 Pa, the upper electrode temperature at 250° C., the lower electrode temperature at 290° C., the RF power source frequency at 13.56 MHz, the distance between the electrodes at 15 nm, and the power of the RF power at an appropriate value. The flow rate of silane and the power of the RF power for respective samples are as follows.

Sample 4 The flow rate of silane: 4 sccm (the flow rate of hydrogen is 186 times that of silane), the power of the RF power: 150 W.

Sample 5 The flow rate of silane: 5 sccm (the flow rate of hydrogen is 150 times that of silane), the power of the RF power: 150 W.

Sample 6 The flow rate of silane: 6 sccm (the flow rate of hydrogen is 125 times that of silane), the power of the RF power: 200 W.

Sample 7 The flow rate of silane: 6 sccm (the flow rate of hydrogen is 125 times that of silane), the power of the RF power: 250 W.

Sample 8 The flow rate of silane: 6 sccm (the flow rate of hydrogen is 125 times that of silane), the power of the RF power: 300 W.

As the second condition for depositing the second microcrystalline silicon film here, a condition similar to the second condition for Sample 3 described in Example 1 was employed (thus, the microcrystalline film was formed in two steps).

Except for the deposition method of the first microcrystalline silicon film, the manufacturing methods of thin film transistors using respective microcrystalline silicon films for respective Samples 4 to 8 whose electric-field effect mobilities are measured are similar to the manufacturing method of Sample 3 described in Example 1. The first microcrystalline silicon films of Samples 4 to 8 were deposited under the above-described respective conditions.

Next, respective manufacturing methods of thin film transistors of Samples 9 to 14, which are comparative examples, are described with reference to FIGS. 3A to 3D and FIGS. 5A to 5C.

The process up to and including the step of forming the gate electrode 103 illustrated in FIG. 3A is similar to that of Samples 1 to 3.

Next, a gate insulating film 105 was formed over the gate electrode 103 and the base insulating film.

The gate insulating film 105 was formed using an insulating film which was formed by stacking a 110-nm-thick silicon oxynitride film over a 110-nm-thick silicon nitride film. The silicon nitride film and the silicon oxynitride film were deposited by a plasma CVD method.

The deposition condition of the silicon nitride film was a condition in which plasma discharge was performed by introducing silane, hydrogen, nitrogen, and ammonia as a source gas at flow rates of 40 sccm, 500 sccm, 550 sccm, and 140 sccm respectively, and setting the pressure inside a treatment chamber at 100 Pa, the RF power source frequency at 13.56 MHz, and the power of the RF power at 370 W. The upper electrode temperature and the lower electrode temperature were set at 280° C. The deposition condition of the silicon oxynitride film was a condition in which plasma discharge was performed by introducing silane and $N_2O$ as a source gas at flow rates of 5 sccm and 600 sccm respectively, and setting the pressure inside a treatment chamber at 25 Pa, the RF power source frequency at 13.56 MHz, and the power of the RF power at 30 W. The upper electrode temperature and the lower electrode temperature were set at 280° C.

Next, a microcrystalline silicon film with a thickness of 30 nm was formed over the gate insulating film 105 under the condition described below. The condition for depositing the microcrystalline silicon film of Samples 9 to 14 was a condition in which plasma discharge was performed in a plasma CVD method by introducing silane, hydrogen, and argon as a source gas at the flow rate described below, a flow rate of 1500 sccm, and a flow rate of 1500 sccm respectively, and setting the pressure inside a treatment chamber at 280 Pa, the RF power source frequency at 13.56 MHz, the power of the RF power at 50 W, and the temperature in the treatment chamber at 280° C. (thus, the microcrystalline silicon film was formed in one step).

Sample 9 The flow rate of silane: 5 sccm (the flow rate of hydrogen is 300 times that of silane).

Sample 10 The flow rate of silane: 6 sccm (the flow rate of hydrogen is 250 times that of silane).

Sample 11 The flow rate of silane: 7 sccm (the flow rate of hydrogen is 214 times that of silane).

Sample 12 The flow rate of silane: 8 sccm (the flow rate of hydrogen is 187 times that of silane).

Sample 13 The flow rate of silane: 9 sccm (the flow rate of hydrogen is 166 times that of silane).

Sample 14 The flow rate of silane: 10 sccm (the flow rate of hydrogen is 150 times that of silane).

Next, a silicon film 111 was formed over the microcrystalline silicon film to have a thickness of 175 nm, and an impurity silicon film 113 was formed over the silicon film 111. The silicon film 111 and the impurity silicon film 113 were deposited by a plasma CVD method.

The deposition condition of the silicon film 111 was a condition in which plasma discharge was performed by introducing silane, hydrogen, argon, and 1000 ppm ammonia (diluted with hydrogen) as a source gas at flow rates of 40 sccm, 1475 sccm, 1500 sccm, and 25 sccm respectively, and setting the pressure inside a treatment chamber at 280 Pa, the RF power source frequency at 13.56 MHz, and the power of the RF power at 50 W. The upper electrode temperature and the lower electrode temperature were set at 280° C.

As the impurity silicon film 113, an amorphous silicon film with a thickness of 50 nm to which phosphorus was added was formed. The deposition condition at this time was a condition in which plasma discharge was performed by introducing silane and 0.5% phosphine (diluted with hydrogen) as a source gas at flow rates of 100 sccm and 170 sccm respectively, and setting the pressure inside a treatment chamber at 170 Pa, the RF power source frequency at 13.56 MHz, and the power of the RF power at 60 W. The upper electrode temperature and the lower electrode temperature were set at 280° C.

The subsequent process was similar to that of Example 1. Specifically, the formation step of a conductive film 127 was similar to that of Samples 1 to 3 in Example 1, the etching step of a silicon stacked body 117 was similar to that of Samples 1 and 2 in Example 1, and the formation step of an insulating film 137 was similar to that of Samples 1 to 3 in Example 1.

Next, the number of mixed phase grains was calculated using SEM photographs showing planes of Samples 4 to 8. The SEM photographs was 630 μm long and 440 μm wide. Then, from the area of each of the SEM photographs and the number of mixed phase grains, the density of mixed phase grains, the average area of a mixed phase grain, and the average diameter of a mixed phase grain were calculated. The results of these calculations are shown in Table 2. In addition, the field-effect mobilities of the thin film transistors of Samples 4 to 8 are shown in Table 2. The density of mixed phase grains of each of Samples 9 to 14 was also measured in a manner similar to that of Samples 4 to 8, and the results are shown in Table 3. In addition, the field-effect mobilities of the thin film transistors of Samples 9 to 14 are shown in Table 3.

TABLE 2

|  | Sample 4 | Sample 5 | Sample 6 | Sample 7 | Sample 8 |
|---|---|---|---|---|---|
| Number of mixed phase grains | 327 | 527 | 579 | 525 | 419 |
| Density of mixed (/μm$^2$) phase grains | 1180 | 1901 | 2089 | 1894 | 1512 |
| Average area (nm$^2$) | 848 | 526 | 479 | 528 | 662 |
| Average diameter (nm) | 32.9 | 25.9 | 24.7 | 25.9 | 29.0 |
| Field-effect (cm$^2$/Vs) mobility | 0.88 | 0.71 | 0.67 | 0.72 | 0.74 |

Measured area: 630 μm × 440 μm

TABLE 3

|  |  | Sample 9 | Sample 10 | Sample 11 | Sample 12 | Sample 13 | Sample 14 |
|---|---|---|---|---|---|---|---|
| Density of mixed phase grains | (/μm$^2$) | 36 | 266 | 680 | 1503 | 1837 | 2258 |
| Field-effect mobility | (cm$^2$/Vs) | 0.34 | 0.33 | 0.49 | 0.67 | 0.74 | 0.72 |

Measured area: 625 nm × 445 nm

Figure 8:
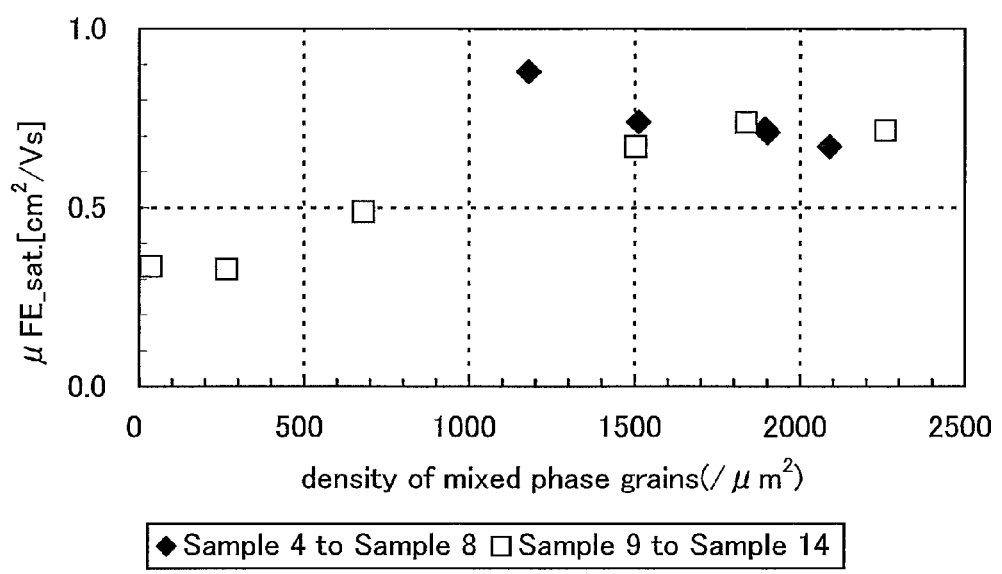
FIG. 8 shows the density of mixed phase grains of microcrystalline silicon films and the field-effect mobilities of thin film transistors formed using the microcrystalline silicon films.

The relation between the density of mixed phase grains and the field-effect mobility in Table 2 and Table 3 is shown in FIG. 8.

According to FIG. 8, it can be found that the field-effect mobility is decreased as the density of mixed phase grains is lower in the comparative examples of Samples 9 to 14, whereas the field-effect mobility is increased as the density of mixed phase grains is lower in Samples 4 to 8 of Example 2. Thus, it can be found in Example 2 that the field-effect mobility is increased as the size of mixed phase grains is larger.

Example 3

In this example, after forming a first microcrystalline silicon film under the first condition described in Embodiment 1, a second microcrystalline silicon film was stacked under the second condition described in Embodiment 1, so that a micro crystalline silicon film was formed; in this manner, samples were manufactured. Then, from the samples, the following points were confirmed: the mixed phase grains are dispersed in the first microcrystalline silicon film; the grain size of the mixed phase grains of the microcrystalline silicon film were uniform and the mixed phase grains are not rough; and mixed phase grains closely in contact with each other are formed in the microcrystalline silicon film. Specific description is given below.

First of all, manufacturing methods of Samples 15 to 17 are described.

A silicon nitride film with a thickness of 300 nm was formed over a glass substrate (EAGLE XG manufactured by Corning Incorporated), the silicon nitride film was subjected to N$_2$O plasma treatment, and a microcrystalline silicon film was formed thereover. Here, the silicon nitride film was formed under a condition similar to that of Samples 1 to 3 of Example 1, and the N$_2$O plasma treatment was performed under a condition similar to that of Samples 2 and 3 of Example 1.

The microcrystalline silicon film in Samples 15 and 16 as comparative examples was formed under only the first condition (thus, the microcrystalline silicon film was formed in one step). The first condition was a condition in which plasma discharge was performed in a plasma CVD method by introducing silane, hydrogen, and argon as a source gas at flow rates of 4 sccm, 750 sccm, and 750 sccm respectively, and setting the pressure inside a treatment chamber at 532 Pa, the RF power source frequency at 13.56 MHz, the power of the RF power at 150 W, the upper electrode temperature at 250° C., and the lower electrode temperature at 290° C. The deposition time of the respective samples is as follows.

Sample 15 The deposition time: 27 seconds
Sample 16 The deposition time: 60 seconds The microcrystalline silicon film of Sample 17 of Example 3 was formed in such a manner that a first microcrystalline silicon film with a thickness of 5 nm was formed under the first condition and a second microcrystalline silicon film with a thickness of 25 nm was deposited thereover under the second condition (thus, the microcrystalline silicon film was formed in two steps).

The first condition was a condition in which plasma discharge was performed in a plasma CVD method by introducing silane, hydrogen, and argon as a source gas at flow rates of 4 sccm, 750 sccm, and 750 sccm respectively, and setting the pressure inside a treatment chamber at 532 Pa, the RF power source frequency at 13.56 MHz, the power of the RF power at 150 W, the upper electrode temperature at 250° C., and the lower electrode temperature at 290° C.

The second condition was a condition in which plasma discharge was performed in a plasma CVD method by introducing silane, hydrogen, and argon as a source gas at flow rates of 1.8 sccm, 750 sccm, and 750 sccm respectively, and setting the pressure inside a treatment chamber at 5000 Pa, the RF power source frequency at 13.56 MHz, the power of the RF power at 125 W, the upper electrode temperature at 250° C., and the lower electrode temperature at 290° C.

Figure 9A:
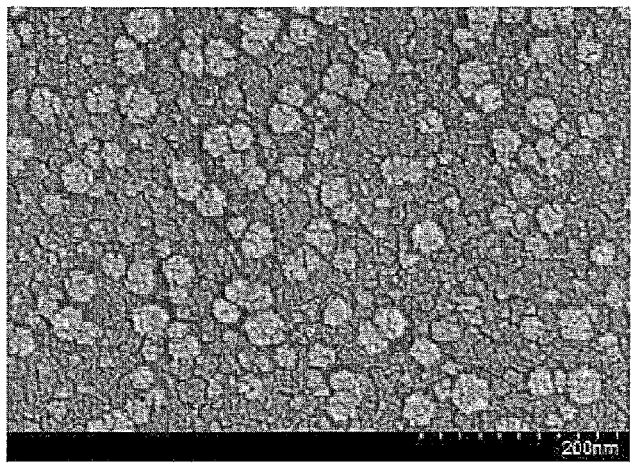
FIG. 9A is a SEM photograph of Sample 15.
Figure 9B:
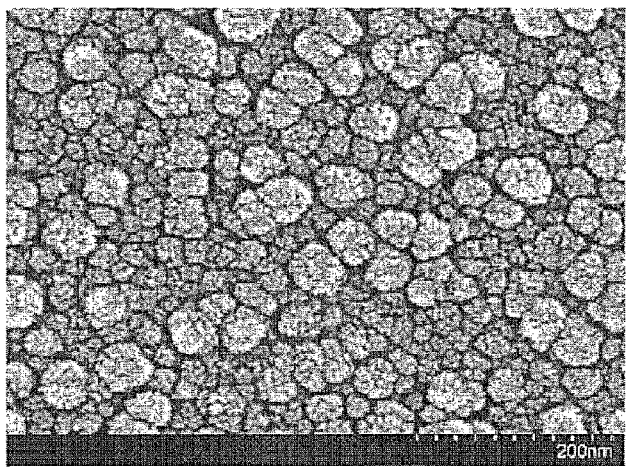
FIG. 9B is a SEM photograph of Sample 16.
Figure 9C:
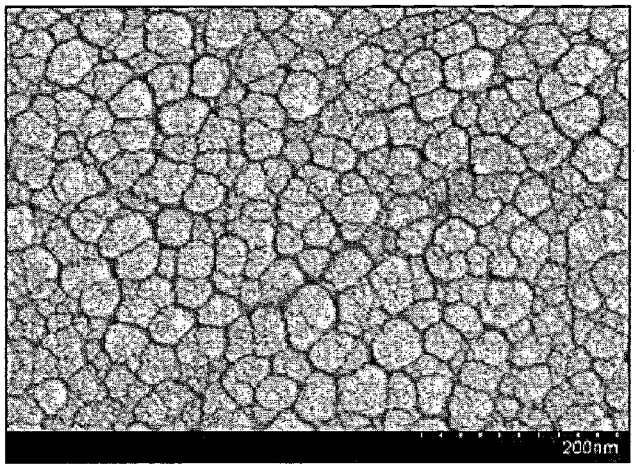
FIG. 9C is a SEM photograph of Sample 17.

Next, the microcrystalline silicon film in each of Samples 15 and 16 of comparative examples and Sample 17 of Example 3 was photographed with a scanning electron microscope, and the SEM photographs (magnified 0.2 million times) are shown in FIGS. 9A to 9C. FIG. 9A is a SEM photograph of Sample 15, FIG. 9B is a SEM photograph of Sample 16, and FIG. 9C is a SEM photograph of Sample 17.

In the microcrystalline silicon film illustrated in FIG. 9A which was deposited for 27 seconds under a pressure of 532 Pa, mixed phase grains are dispersed. In the microcrystalline silicon film (comparative example) illustrated in FIG. 9B which was deposited for 60 seconds under a pressure of 532 Pa, grain sizes of mixed phase grains are not uniform and surfaces of the mixed phase grains are rough. In contrast, in the microcrystalline silicon film (Example 3) illustrated in FIG. 9C which was formed in two steps by depositing the first microcrystalline silicon film at 532 Pa and then depositing the second microcrystalline silicon film at 5000 Pa, the uniformity of grain size of mixed phase grains is high and mixed phase grains are closely adjacent to each other as compared to the microcrystalline silicon film of FIG. 9B.

Figure 10A:
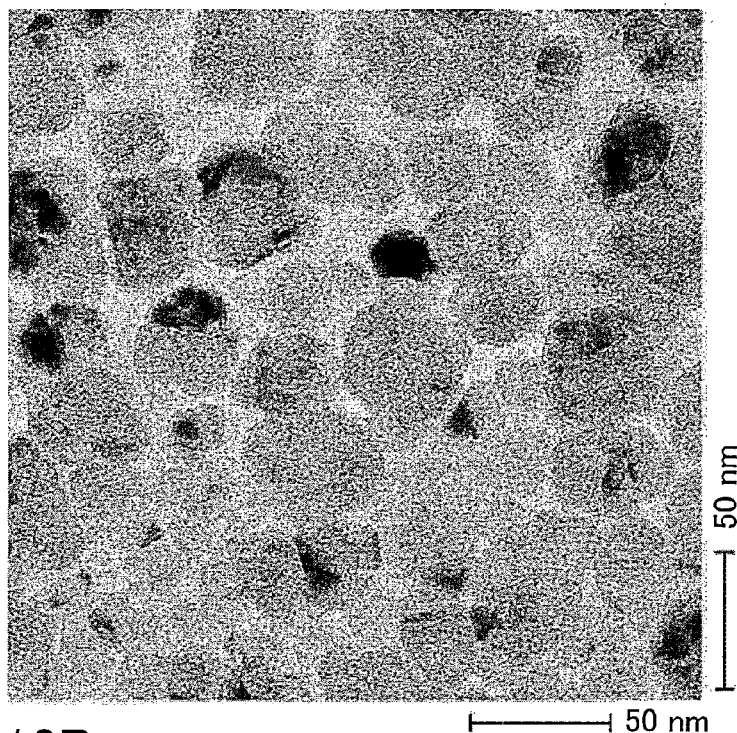
FIG. 10A is a TEM image of Sample 16 (magnified 0.5 million times)
Figure 10B:
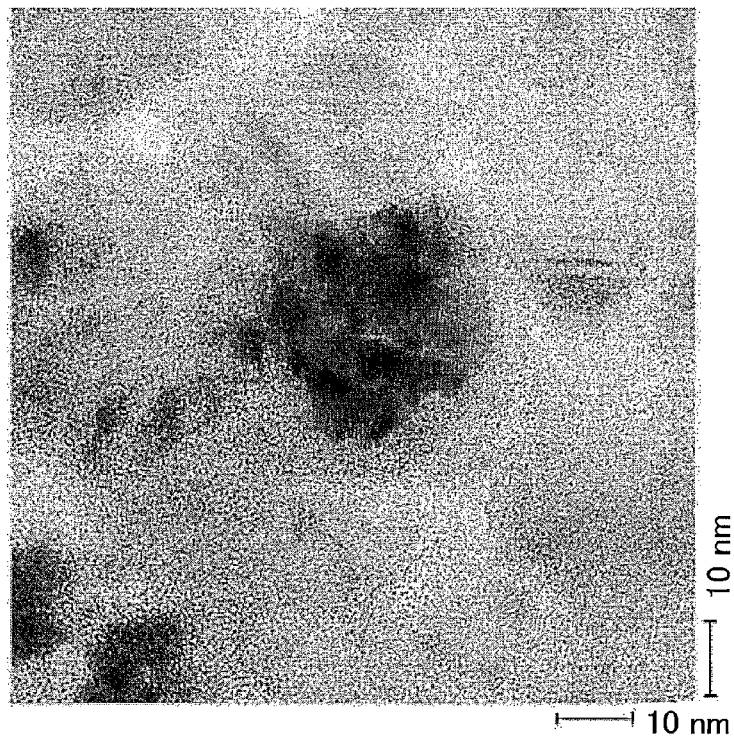
FIG. 10B is a TEM image of Sample 16 (magnified 2 million times)
Figure 11A:
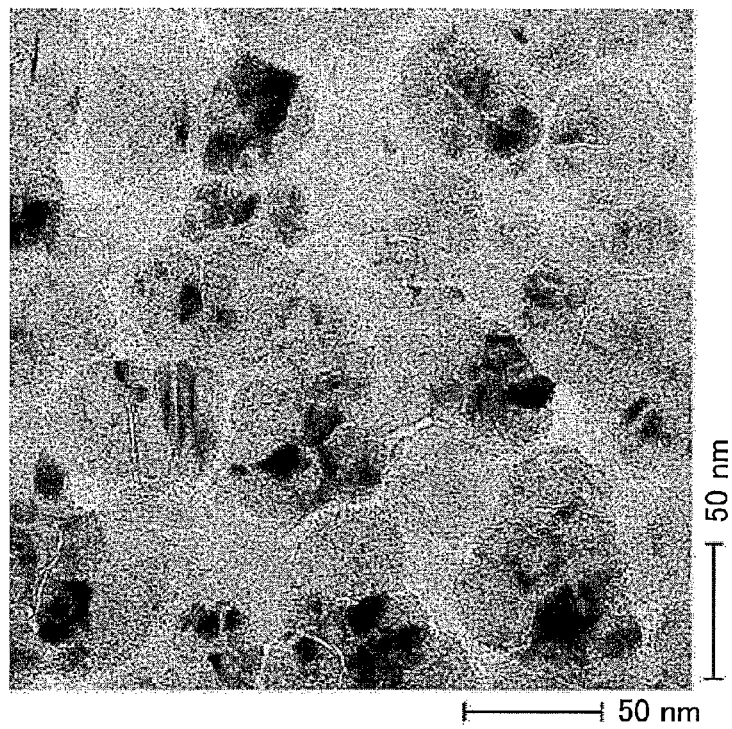
FIG. 11A is a TEM image of Sample 17 (magnified 0.5 million times)
Figure 11B:
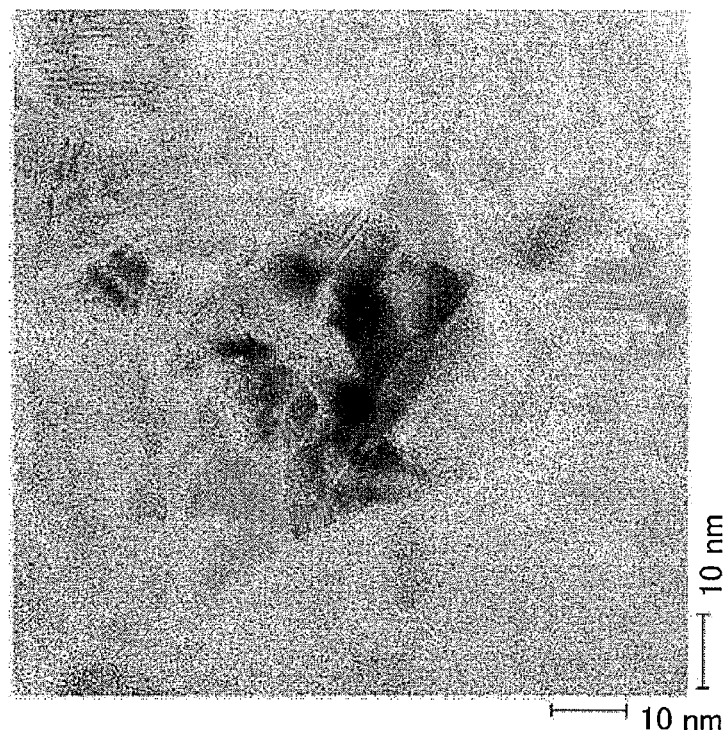
FIG. 11B is a TEM image of Sample 17 (magnified 2 million times)

Next, the microcrystalline silicon films formed under conditions similar to those of Samples 16 and 17 of the comparative examples are photographed with a transmission electron microscope, and the TEM images are illustrated in FIGS. 10A and 10B and FIGS. 11A and 11B. FIG. 10A shows a TEM image (magnified 0.5 million times) of Sample 16 and FIG. 10B shows a TEM image (magnified 2 million times) of Sample 16. FIG. 11A shows a TEM image (magnified 0.5 million times) of Sample 17 and FIG. 11B shows a TEM image (magnified 2 million times) of Sample 17.

In FIGS. 10A and 10B, spaces between mixed phase grains can be observed in the microcrystalline silicon film with a thickness of 40 nm deposited under a pressure of 532 Pa (comparative example). In contrast, in the microcrystalline silicon film shown in FIGS. 11A and 11B (Example 3), which was formed in 2 steps by depositing the 5-nm-thick first microcrystalline silicon film at 532 Pa and the 35-nm-thick second microcrystalline silicon film at 5000 Pa, mixed phase grains are closely adjacent to each other as compared to the microcrystalline silicon film of FIGS. 10A and 10B.

Next, the density of mixed phase grains in the respective microcrystalline silicon films of Samples 16 and 17 was measured by an X-ray reflectometer (XRR), and the results are shown in Table 4.

TABLE 4

|  | Density (g/cm$^3$) |
| --- | --- |
| Sample 16 | 1.9 |
| Sample 17 | 2.2 |

The density of the microcrystalline silicon film of Sample 17 formed in 2 steps is closer to the density of single crystal silicon (2.35 g/cm$^3$); accordingly, it can be understood that mixed phase grains are dense in the microcrystalline silicon film of Sample 17.

Example 4

In this example, as for thin film transistors (Samples 18 to 20) which include the microcrystalline silicon film deposited in only one step described in Embodiment 1 and thin film transistors (Samples 21 to 26) which include the first microcrystalline silicon film deposited in the first step and the second microcrystalline silicon film deposited in the second step so as to be stacked thereover, the relation between the field-effect mobility and the deposition pressure at the time of depositing the microcrystalline silicon film was investigated. Specific description is given below.

First of all, manufacturing methods of thin film transistors of Samples 18 to 26 are described.

Except for the deposition method of the microcrystalline silicon film, the manufacturing methods of thin film transistors of Samples 18 to 26 are similar to that of Sample 3 described in Example 1. The microcrystalline silicon films of Samples 18 to 26 were deposited under the following respective conditions.

The microcrystalline silicon film of Samples 18 to 20 as comparative examples was deposited in only 1 step. The deposition condition was a condition in which plasma discharge was performed in a plasma CVD method by introducing silane, hydrogen, and argon as a source gas at the respective flow rates described below, and setting the pressure inside a treatment chamber at the pressure described below, the RF power source frequency at 13.56 MHz, the power of the RF power at the power described below, and the upper electrode temperature and the lower electrode temperature at the temperatures described below.

Sample 18 The flow rate of silane: 8 sccm, the flow rate of hydrogen: 1500 sccm, the flow rate of argon: 1500 sccm, the pressure inside the treatment chamber: 280 Pa (the pressure similar to that for Sample 12), the power of the RF power: 50 W, the upper electrode temperature: 280° C., the lower electrode temperature: 280° C., and the thickness of the microcrystalline silicon film: 30 nm.

Sample 19 The flow rate of silane: 2.5 sccm, the flow rate of hydrogen: 750 sccm, the flow rate of argon: 750 sccm, the pressure inside the treatment chamber: 1237 Pa, the power of the RF power: 120 W, the upper electrode temperature: 200° C., the lower electrode temperature: 300° C., and the thickness of the microcrystalline silicon film: 70 nm.

Sample 20 The flow rate of silane: 2.5 sccm, the flow rate of hydrogen: 750 sccm, the flow rate of argon: 750 sccm, the pressure inside the treatment chamber: 5000 Pa (the pressure similar to that for Sample 2), the power of the RF power: 300 W, the upper electrode temperature: 250° C., the lower electrode temperature: 290° C., and the thickness of the microcrystalline silicon film: 30 nm.

In Samples 21 and 25 of comparative examples and Samples 22 to 24 and Sample 26 of Example 4, the microcrystalline silicon film was formed by depositing the first microcrystalline silicon film under the first condition and then depositing the second microcrystalline silicon film thereover under the second condition (i.e., the microcrystalline silicon film was formed in two steps).

The first condition for Samples 21 to 26 was a condition in which plasma discharge was performed in a plasma CVD method by introducing silane, hydrogen, and argon as a source gas at the flow rates described below, at a flow rate of 750 sccm, and at a flow rate of 750 sccm respectively, and setting the RF power source frequency at 13.56 MHz, the power of the RF power at the power described below, the upper electrode temperature at 250° C. (at 200° C. for Sample 26), and the lower electrode temperature at 290° C. (at 300° C. for Sample 26). The pressure inside a treatment chamber for Samples 21 to 25 was set at 532 Pa (the pressure similar to that for Sample 3), and that for Sample 26 was set at 1250 Pa.

Sample 21 The flow rate of silane: 6 sccm, the power of the RF power: 250 W, the thickness of the first microcrystalline silicon film: 5 nm.

Sample 22 The flow rate of silane: 4 sccm, the power of the RF power: 200 W, the thickness of the first microcrystalline silicon film: 5 nm.

Sample 23 The flow rate of silane: 4 sccm, the power of the RF power: 150 W, the thickness of the first microcrystalline silicon film: 5 nm.

Sample 24 The flow rate of silane: 4 sccm, the power of the RF power: 150 W, the thickness of the first microcrystalline silicon film: 5 nm.

Sample 25 The flow rate of silane: 6 sccm, the power of the RF power: 250 W, the thickness of the first microcrystalline silicon film: 5 nm.

Sample 26 The flow rate of silane: 2.5 sccm, the power of the RF power: 120 W, the thickness of the first microcrystalline silicon film: 5 nm.

The second condition was a condition in which plasma discharge was performed in a plasma CVD method by introducing silane, hydrogen, and argon as a source gas at the respective flow rates described below, and setting the pressure inside a treatment chamber at the pressure described below, the RF power source frequency at 13.56 MHz, the power of the RF power at the power described below, the upper electrode temperature at 250° C. (at 200° C. for Sample 26), and the lower electrode temperature at 290° C. (at 300° C. for Sample 26).

Sample 21 The flow rate of silane: 4 sccm, the flow rate of hydrogen: 750 sccm, the flow rate of argon: 750 sccm, the pressure inside the treatment chamber: 532 Pa, the power of the RF power: 25 W, the thickness of the second microcrystalline silicon film: 25 nm.

Sample 22 The flow rate of silane: 1.8 sccm, the flow rate of hydrogen: 750 sccm, the flow rate of argon: 750 sccm, the pressure inside the treatment chamber: 5000 Pa (the pressure similar to that for Sample 3), the power of the RF power: 125 W, the thickness of the second microcrystalline silicon film: 65 nm.

Sample 23 The flow rate of silane: 2 sccm, the flow rate of hydrogen: 1500 sccm, the flow rate of argon: 1500 sccm, the pressure inside the treatment chamber: 3000 Pa, the power of the RF power: 50 W, the thickness of the second microcrystalline silicon film: 80 nm.

Sample 24 The flow rate of silane: 2 sccm, the flow rate of hydrogen: 1500 sccm, the flow rate of argon: 1500 sccm, the pressure inside the treatment chamber: 10000 Pa, the power of the RF power: 350 W, the thickness of the second microcrystalline silicon film: 80 nm.

Sample 25 The flow rate of silane: 3 sccm, the flow rate of hydrogen: 750 sccm, the flow rate of argon: 750 sccm, the pressure inside the treatment chamber: 1237 Pa, the power of the RF power: 100 W, the thickness of the second microcrystalline silicon film: 25 nm.

Sample 26 The flow rate of silane: 1.5 sccm, the flow rate of hydrogen: 750 sccm, the flow rate of argon: 750 sccm, the pressure inside the treatment chamber: 10000 Pa, the power of the RF power: 300 W, the thickness of the second microcrystalline silicon film: 65 nm.

Figure 12:
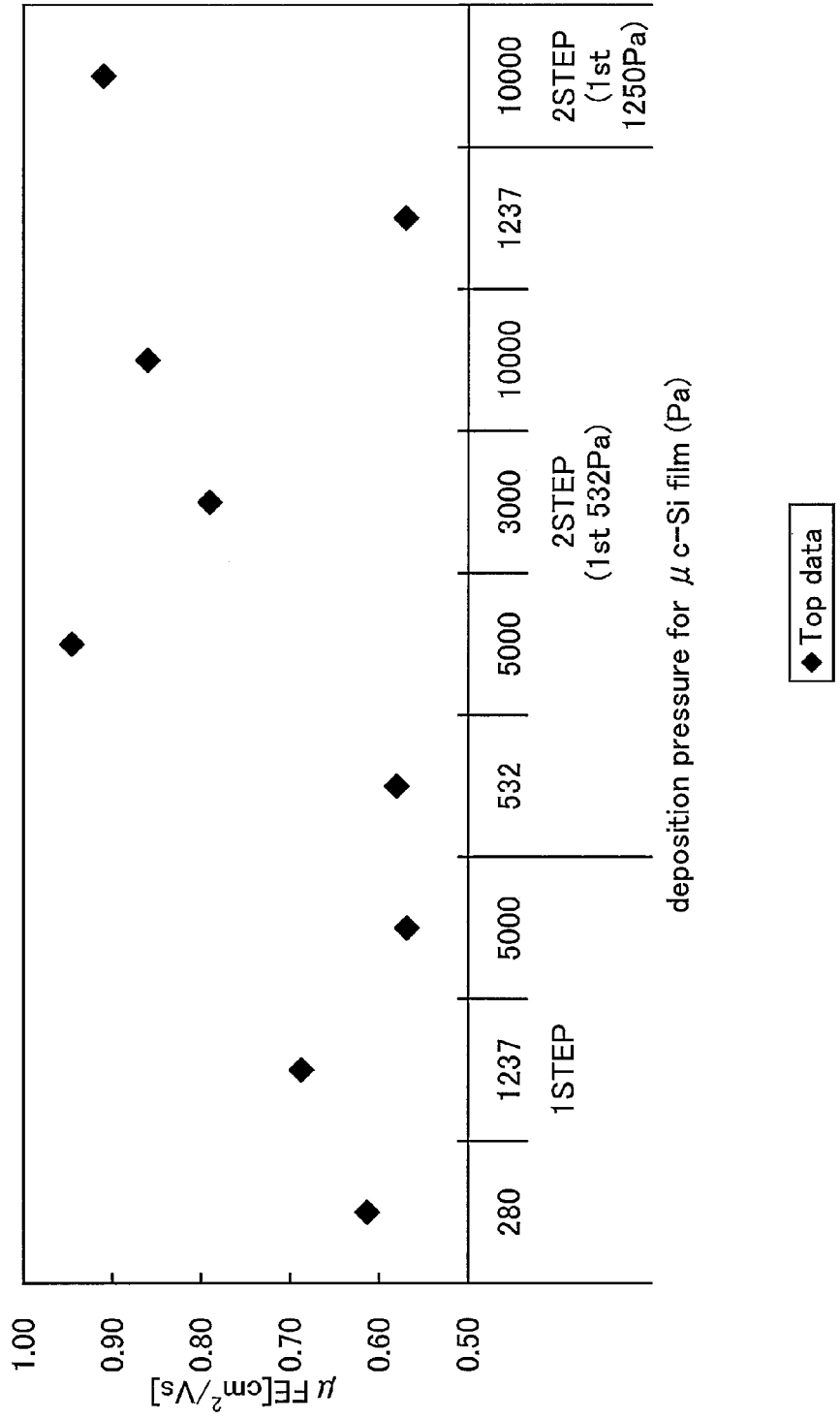
FIG. 12 shows a relation between the measured field-effect mobilities (μFE) of thin film transistors formed using microcrystalline silicon films of Samples 18 to 26 and the deposition pressure.

Next, the field-effect mobilities (μFE) of the microcrystalline silicon films of Samples 18 to 26 were measured, and the relation between the results of the field-effect mobility and the deposition pressure (the deposition pressure in one step or two steps in the deposition conditions of the microcrystalline silicon film) is shown in FIG. 12.

In FIG. 12, the data at a pressure of 280 Pa in 1-step method is of Sample 18, the data at a pressure of 1237 Pa in 1-step method is of Sample 19, and the data at a pressure of 5000 Pa in 1-step method is of Sample 20. Further, the data at a pressure of 532 Pa in the first step and 532 Pa in the second step is of Sample 21, the data at a pressure of 532 Pa in the first step and 5000 Pa in the second step is of Sample 22, the data at a pressure of 532 Pa in the first step and 3000 Pa in the second step is of Sample 23, the data at a pressure of 532 Pa in the first step and 10000 Pa in the second step is of Sample 24, the data at a pressure of 532 Pa in the first step and 1237 Pa in the second step is of Sample 25, and the data at a pressure of 1250 Pa in the first step and 10000 Pa in the second step is of Sample 26. Note that in FIG. 12, the top data of field-effect mobility among data of a plurality of test thin film transistors is plotted for each sample.

From FIG. 12, it can be found that the field-effect mobility can be drastically improved when the 2-step method is employed and the deposition pressure in the first step is 1250 Pa or lower and the deposition pressure in the second step is higher than 1237 Pa, or further 3000 Pa or higher.

This application is based on Japanese Patent Application serial no. 2010-112164 filed with Japan Patent Office on May 14, 2010, the entire contents of which are hereby incorporated by reference.

The invention claimed is:

1. A manufacturing method of a microcrystalline silicon film, comprising the steps of:
    forming a first microcrystalline silicon film which comprises a mixed phase grain including a silicon crystallite and amorphous silicon, over an insulating film by a plasma CVD method under a first condition;
    forming a second microcrystalline silicon film over the first microcrystalline silicon film by a plasma CVD method under a second condition; and
    forming a third microcrystalline silicon film over the second microcrystalline silicon film by a plasma CVD method under a third condition, after the second microcrystalline silicon film is formed under the second condition,
    wherein the first condition is a condition in which a deposition gas containing silicon and a gas containing hydrogen are supplied to a treatment chamber as a source gas, the deposition gas is diluted with hydrogen by setting a flow rate of hydrogen at a flow rate greater than or equal to 50 times and less than or equal to 1000 times that of the deposition gas, and a pressure inside the treatment chamber is set higher than or equal to 67 Pa and lower than or equal to 1333 Pa,
    wherein the second condition is a condition in which a deposition gas containing silicon and a gas containing hydrogen are supplied to a treatment chamber as a source gas, the deposition gas is diluted with hydrogen by setting a flow rate of hydrogen at a flow rate greater than or equal to 100 times and less than or equal to 2000 times that of the deposition gas, and a pressure inside the treatment chamber is set higher than or equal to 1333 Pa and lower than or equal to 13332 Pa,
    wherein the third condition is a condition in which a deposition gas containing silicon and a gas containing hydrogen are supplied to a treatment chamber as a source gas, the deposition gas is diluted with hydrogen by setting a ratio of a flow rate of hydrogen to a flow rate of the deposition gas at a ratio higher than that in the second condition, and a pressure inside the treatment chamber is set higher than or equal to 1333 Pa and lower than or equal to 13332 Pa, and
    wherein a rare gas is contained in at least one of the source gas of the first condition, the source gas of the second condition, and the source gas of the third condition.

2. The manufacturing method of the microcrystalline silicon film, according to claim 1,
    wherein the first condition is a condition which allows mixed phase grains serving as nuclei to be formed and a density of the mixed phase grains to be more than or equal to $100/\mu m^2$ and less than or equal to $10000/\mu m^2$, and
    wherein the second condition is a condition which allows a density of the microcrystalline silicon film to be higher than $1.9$ g/cm$^3$ and lower than or equal to $2.3$ g/cm$^3$.

3. The manufacturing method of a microcrystalline silicon film, according to claim 1, wherein the first condition is a condition which allows higher crystallinity of the mixed phase grains and higher crystal growth rate of the mixed phase grains than those in the second condition.

4. A manufacturing method of a semiconductor device comprising a thin film transistor including a gate electrode, a source region, a drain region, and a channel region, comprising a step of:
    forming a microcrystalline silicon film comprising the channel region by forming a first microcrystalline silicon film comprising a mixed phase grain including a silicon crystallite and amorphous silicon by a plasma CVD method under a first condition and forming a second microcrystalline silicon film over the first microcrystalline silicon film by a plasma CVD method under a second condition, wherein the first condition is a condition in which a deposition gas containing silicon and a gas containing hydrogen are supplied to a treatment chamber as a source gas, the deposition gas is diluted with hydrogen by setting a flow rate of hydrogen at a flow rate greater than or equal to 50 times and less than or equal to 1000 times that of the deposition gas, and a pressure inside the treatment chamber is set higher than or equal to 67 Pa and lower than or equal to 1333 Pa, and wherein the second condition is a condition in which a deposition gas containing silicon and a gas containing hydrogen are supplied to a treatment chamber as a source gas, the deposition gas is diluted with hydrogen by setting a flow rate of hydrogen at a flow rate greater than or equal to 100 times and less than or equal to 2000 times that of the deposition gas, and a pressure inside the treatment chamber is set higher than or equal to 1333 Pa and lower than or equal to 13332 Pa.

5. The manufacturing method of the semiconductor device, according to claim 4, wherein the microcrystalline silicon film is formed by forming a third microcrystalline silicon film over the second microcrystalline silicon film by a plasma CVD method under a third condition after the second microcrystalline silicon film is formed under the second condition, and wherein the third condition is a condition in which a deposition gas containing silicon and a gas containing hydrogen are supplied to a treatment chamber as a source gas, the deposition gas is diluted with hydrogen by setting a ratio of a flow rate of hydrogen to a flow rate of the deposition gas at a ratio higher than that in the second condition, and the pressure inside the treatment chamber is set higher than or equal to 1333 Pa and lower than or equal to 13332 Pa.

6. A microcrystalline silicon film over an insulating film comprising:

mixed phase grains including a silicon crystallite and amorphous silicon, wherein the mixed phase grains have a grain size greater than or equal to 2 nm and less than or equal to 200 nm, wherein the microcrystalline silicon film has a density greater than 1.9 g/cm$^3$ and less than or equal to 2.3 g/cm$^3$, and wherein the microcrystalline silicon film has a resistivity higher than or equal to $1.0 \times 10^5$ Ω·cm and lower than or equal to $1.0 \times 10^8$ Ω·cm.

7. The microcrystalline silicon film according to claim 6, wherein the microcrystalline silicon film is a film in which a second microcrystalline silicon film is stacked over a first microcrystalline silicon film, wherein the first microcrystalline silicon film is formed by a plasma CVD method under a first condition which allows the mixed phase grains serving as nuclei to be formed and a density of the mixed phase grains to be more than or equal to 100/μm$^2$ and less than or equal to 10000/μm$^2$, and wherein the second microcrystalline silicon film is formed by a plasma CVD method under a second condition which allows the second microcrystalline silicon film to fill a space between the mixed phase grains of the first microcrystalline silicon film.

8. The microcrystalline silicon film according to claim 6, wherein the microcrystalline silicon film has an activation energy of 0.5 eV to 0.6 eV.

9. A semiconductor device comprising:
a thin film transistor comprising:
a gate electrode;
a source region;
a drain region; and
a channel region, wherein the channel region is formed using a microcrystalline silicon film comprising a mixed phase grain including a silicon crystallite and amorphous silicon, wherein the mixed phase grain has a grain size greater than or equal to 2 nm and less than or equal to 200 nm, wherein the microcrystalline silicon film has a density greater than 1.9 g/cm$^3$ and less than or equal to 2.3 g/cm$^3$, and wherein the microcrystalline silicon film has a resistivity higher than or equal to $1.0 \times 10^5$ Ω·cm and lower than or equal to $1.0 \times 10^8$ Ω·cm.

10. The semiconductor device according to claim 9, wherein the microcrystalline silicon film has an activation energy of 0.5 eV to 0.6 eV.

* * * * *